(12) United States Patent
Nguyen et al.

(10) Patent No.: US 7,447,079 B2
(45) Date of Patent: Nov. 4, 2008

(54) METHOD FOR SENSING NEGATIVE THRESHOLD VOLTAGES IN NON-VOLATILE STORAGE USING CURRENT SENSING

(75) Inventors: Hao Thai Nguyen, San Jose, CA (US);
Seungpil Lee, San Ramon, CA (US);
Man Lung Mui, Santa Clara, CA (US);
Shahzad Khalid, Union City, CA (US);
Hock So, Redwood City, CA (US);
Prashanti Govindu, Santa Clara, CA (US); Nima Mokhlesi, Los Gatos, CA (US); Deepak Chandra Sekar, Atlanta, GA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/771,982

(22) Filed: Jun. 29, 2007

(65) Prior Publication Data
US 2008/0247238 A1  Oct. 9, 2008

Related U.S. Application Data

(60) Provisional application No. 60/910,397, filed on Apr. 5, 2007, provisional application No. 60/910,400, filed on Apr. 5, 2007, provisional application No. 60/910,404, filed on Apr. 5, 2007.

(51) Int. Cl.
*G11C 16/04* (2006.01)
*G11C 16/06* (2006.01)

(52) U.S. Cl. ............... 365/185.21; 365/185.17; 365/185.27

(58) Field of Classification Search ......... 365/185.21
See application file for complete search history.

(56) References Cited

U.S. PATENT DOCUMENTS

| 5,371,715 A | 12/1994 | Kim |
| 5,386,422 A | 1/1995 | Endoh |
| 5,522,580 A | 6/1996 | Varner, Jr. |

(Continued)

OTHER PUBLICATIONS

U.S. Appl. No. 11/771,987, filed Jun. 29, 2007.

*Primary Examiner*—Son L Mai
(74) *Attorney, Agent, or Firm*—Vierra Magen Marcus & DeNiro LLP

(57) ABSTRACT

Current sensing is performed in a non-volatile storage device for a selected non-volatile storage element with a negative threshold voltage. A control gate read voltage is applied to a selected word line of a non-volatile storage element, and source and p-well voltages are applied to a source and a p-well, respectively, associated with the non-volatile storage element. The source and p-well voltages exceed the control gate read voltage so that a positive control gate read voltage can be used. There is no need for a negative charge pump to apply a negative word line voltage even for sensing a negative threshold voltage. A programming condition of the non-volatile storage element is determined by sensing a voltage drop which is tied to a fixed current which flows in a NAND string of the non-volatile storage element.

19 Claims, 24 Drawing Sheets

U.S. PATENT DOCUMENTS

| | | | |
|---|---|---|---|
| 5,570,315 | A | 10/1996 | Tanaka |
| 5,774,397 | A | 6/1998 | Endoh |
| 5,886,926 | A | 3/1999 | Marquot |
| 5,994,732 | A * | 11/1999 | Ajika et al. .................. 257/315 |
| 6,046,935 | A | 4/2000 | Takeuchi |
| 6,097,638 | A | 8/2000 | Himeno et al. |
| 6,222,762 | B1 | 4/2001 | Guterman |
| 6,225,834 | B1 | 5/2001 | Gang |
| 6,404,678 | B1 | 6/2002 | Lin |
| 6,456,528 | B1 | 9/2002 | Chen |
| 6,469,546 | B2 | 10/2002 | Matano |
| 6,522,580 | B2 | 2/2003 | Chen |
| 6,525,969 | B1 | 2/2003 | Kurihara et al. |
| 6,560,152 | B1 | 5/2003 | Cernea |
| 6,665,213 | B1 | 12/2003 | Michael et al. |
| 6,751,125 | B2 | 6/2004 | Prinz et al. |
| 6,795,342 | B1 * | 9/2004 | He et al. ................. 365/185.16 |
| 6,859,397 | B2 | 2/2005 | Lutze |
| 6,888,190 | B2 | 5/2005 | Yang et al. |
| 6,916,708 | B2 * | 7/2005 | Tao et al. .................... 438/257 |
| 7,031,210 | B2 | 4/2006 | Park et al. |
| 7,038,963 | B2 | 5/2006 | Lee |
| 7,046,568 | B2 | 5/2006 | Cernea |
| 7,057,958 | B2 | 6/2006 | So et al. |
| 7,196,928 | B2 | 3/2007 | Chen |
| 7,212,445 | B2 | 5/2007 | Cernea et al. |
| 7,301,817 | B2 * | 11/2007 | Li et al. .................. 365/185.22 |
| 2003/0058722 | A1 | 3/2003 | Park |
| 2004/0057287 | A1 | 3/2004 | Cernea |
| 2004/0057318 | A1 | 3/2004 | Cernea |
| 2004/0109357 | A1 | 6/2004 | Cernea |
| 2004/0255090 | A1 | 12/2004 | Guterman |
| 2005/0024939 | A1 | 2/2005 | Chen |
| 2005/0117424 | A1 | 6/2005 | Sung |
| 2006/0126390 | A1 | 6/2006 | Gorobets |
| 2006/0133172 | A1 | 6/2006 | Schnabel et al. |
| 2006/0140007 | A1 | 6/2006 | Cernea |
| 2006/0158947 | A1 | 7/2006 | Chan |
| 2006/0203545 | A1 | 9/2006 | Cernea |
| 2007/0008779 | A1 | 1/2007 | Isobe |
| 2007/0014161 | A1 | 1/2007 | Li et al. |
| 2007/0058435 | A1 | 3/2007 | Chen et al. |
| 2007/0076501 | A1 | 4/2007 | Kang et al. |

* cited by examiner

Lower page

Middle page

Upper page with verify levels

Upper page with read levels

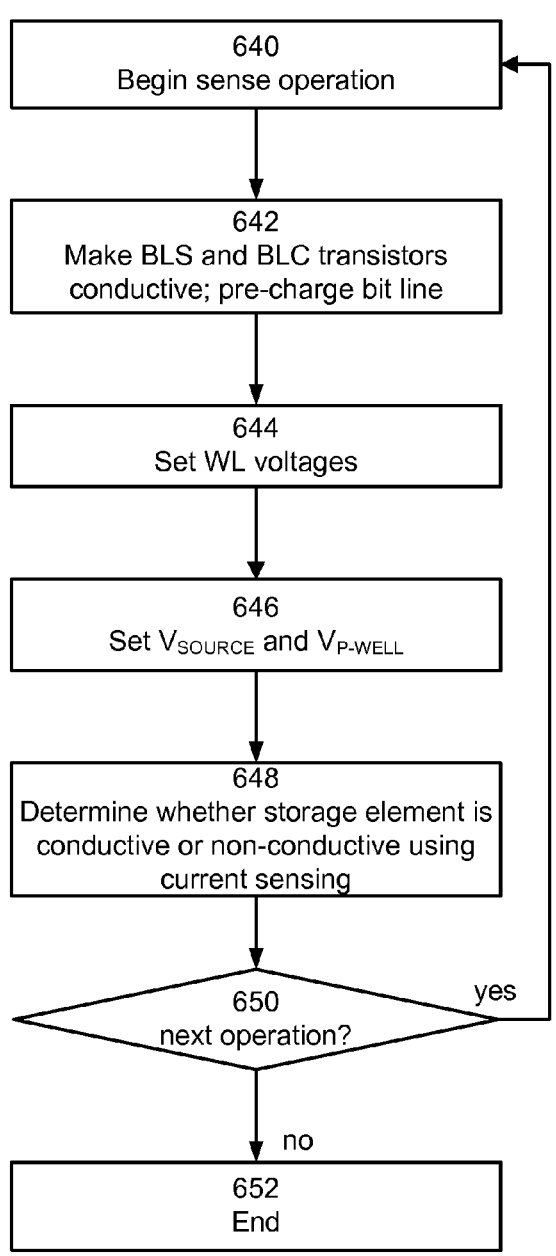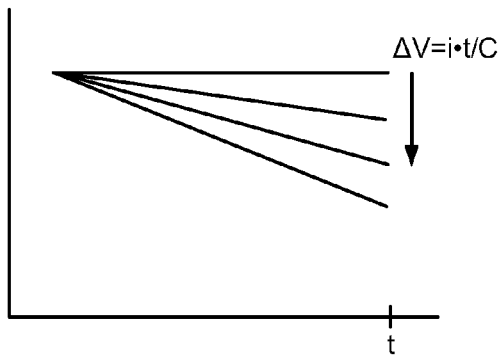

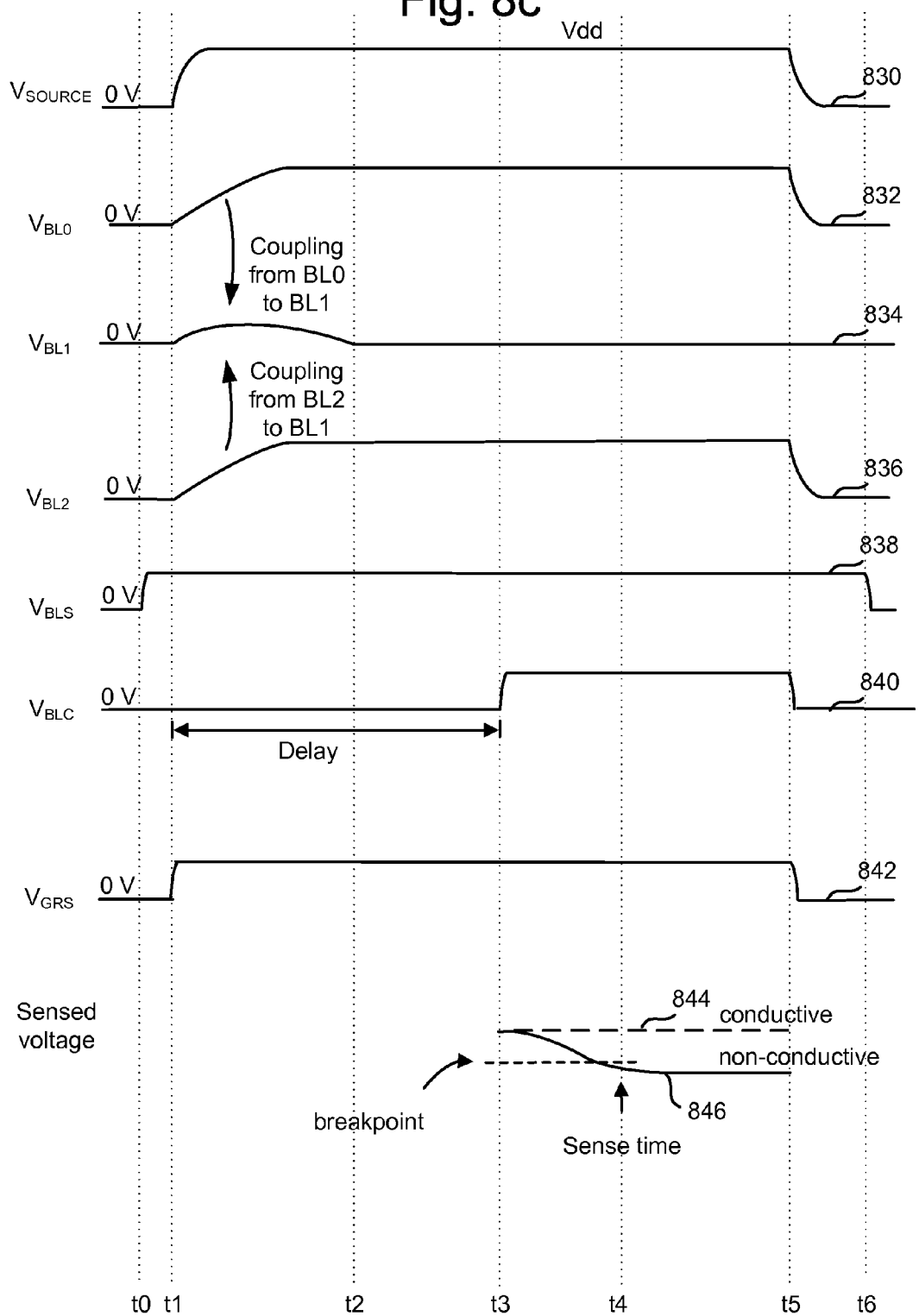

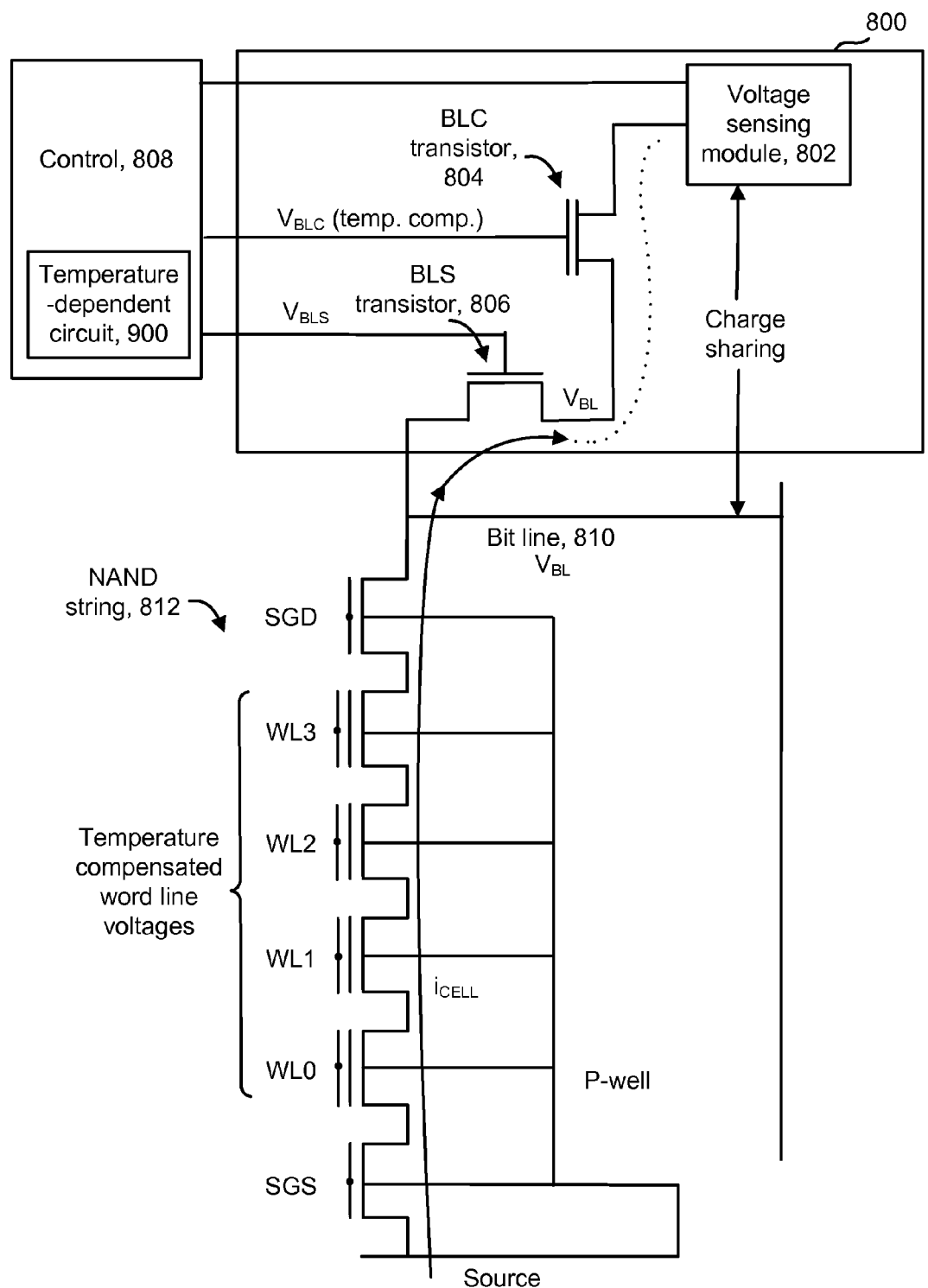

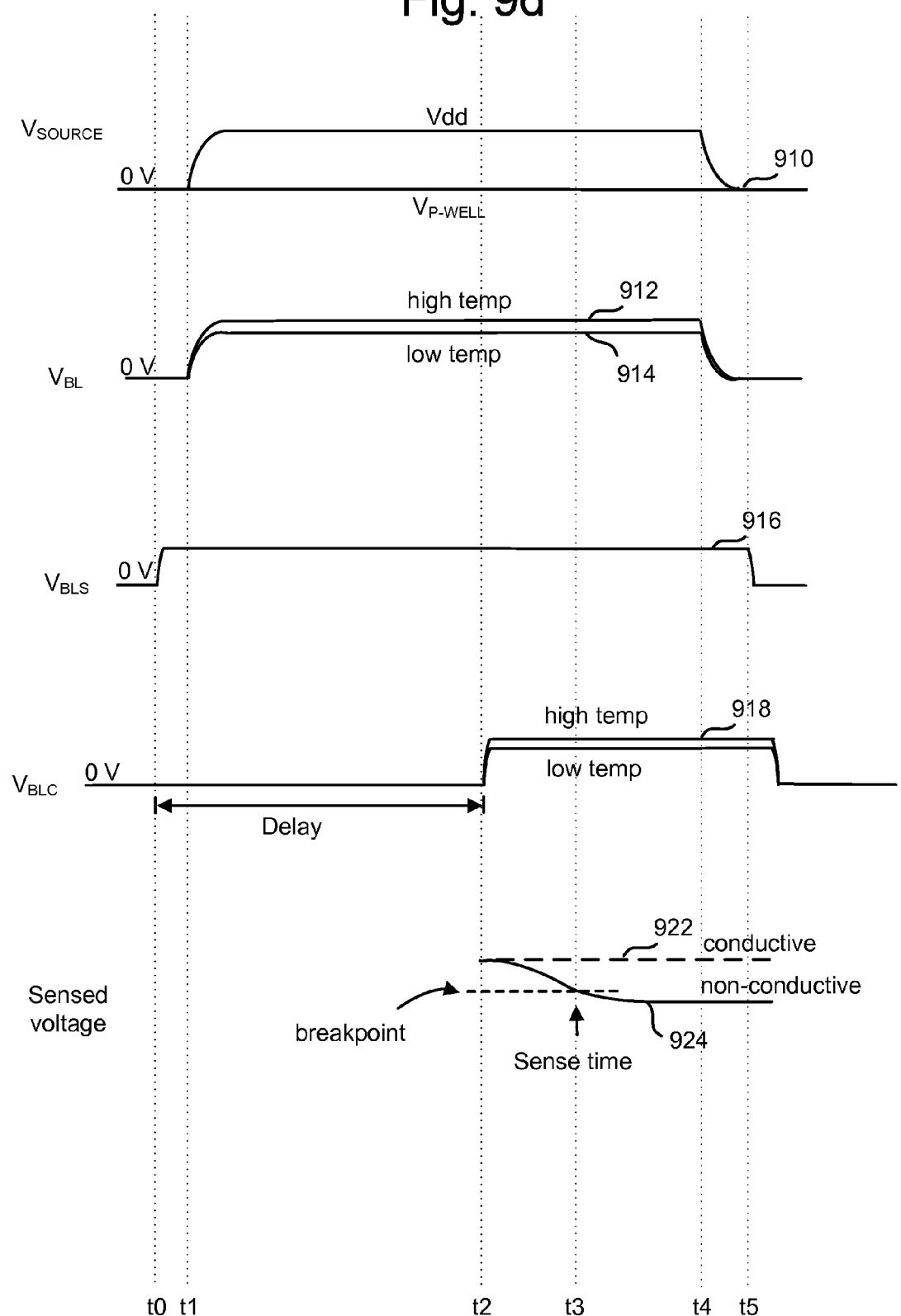

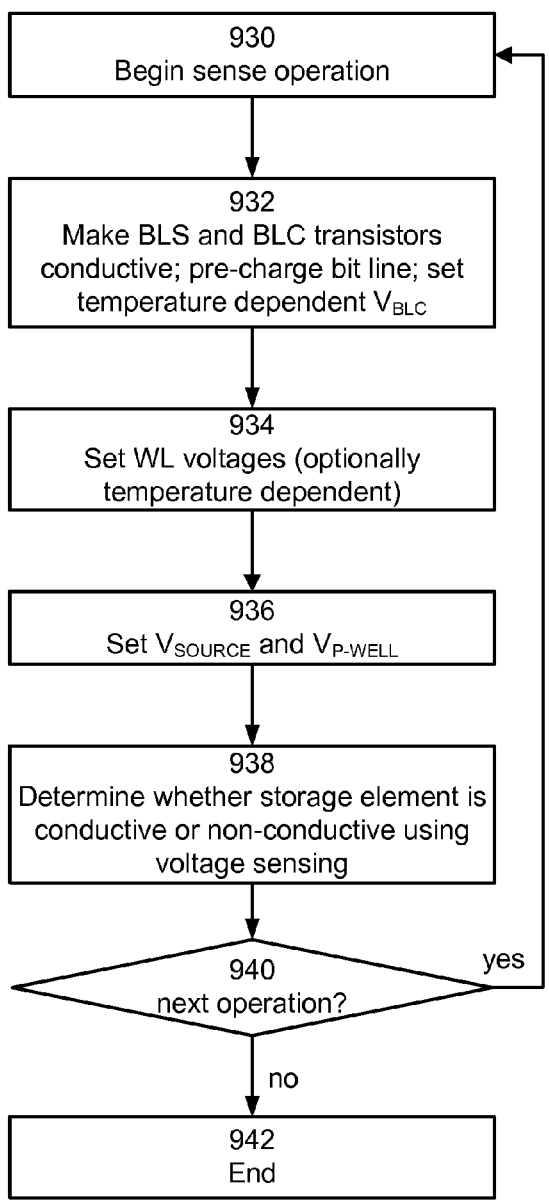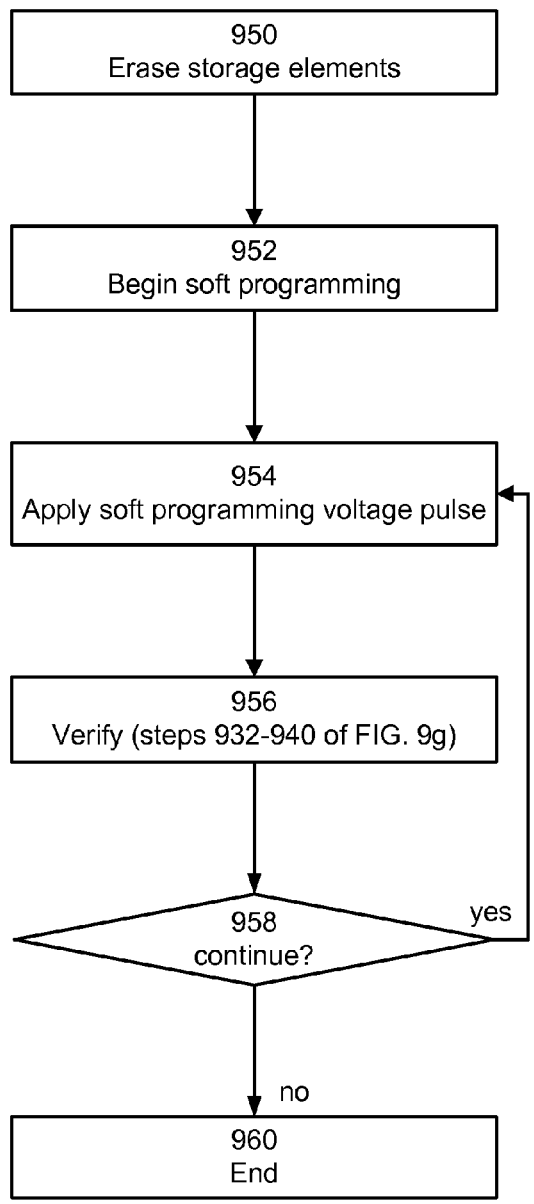

METHOD FOR SENSING NEGATIVE THRESHOLD VOLTAGES IN NON-VOLATILE STORAGE USING CURRENT SENSING

CROSS REFERENCE TO RELATED APPLICATIONS

This application claims the benefit of U.S. provisional patent application No. 60/910,397, U.S. provisional patent application No. 60/910,400, and U.S. provisional patent application No. 60/910,404, each of which was filed on Apr. 5, 2007, and each of which is incorporated herein by reference.

This application is related to the following co-pending, commonly assigned U.S. patent applications:

U.S. patent application Ser. No. 11/771,982, titled "Non-Volatile Storage With Current Sensing of Negative Threshold Voltages", U.S. patent application Ser. No. 11/771,987, titled "Method for Current Sensing With Biasing Of Source And P-Well In Non-Volatile Storage", U.S. patent application Ser. No. 11/771,997, titled "Non-Volatile Storage using Current Sensing With Biasing Of Source And P-Well", U.S. patent application Ser. No. 11/772,002, titled "Method for Source Bias All Bit Line Sensing in Non-Volatile Storage", U.S. patent application Ser. No. 11/772,009, titled "Non-Volatile Storage with Source Bias All Bit Line Sensing", U.S. patent application Ser. No. 11/772,015, titled "Method For Temperature Compensating Bit Line During Sense Operations In Non-Volatile Storage", and U.S. patent application Ser. No. 11/772,018, titled "Non-Volatile Storage With Temperature Compensation For Bit Line During Sense Operations", each of which is filed herewith, and each of which is incorporated herein by reference.

BACKGROUND OF THE INVENTION

1. Field of the Invention

The present invention relates to non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. No. 6,859,397, titled "Source Side Self Boosting Technique For Non-Volatile Memory," and in U.S. Patent App. Pub. 2005/0024939, titled "Detecting Over Programmed Memory," published Feb. 3, 2005; both of which are incorporated herein by reference in their entirety.

SUMMARY OF THE INVENTION

The present invention provides a method for sensing negative threshold voltages of non-volatile storage elements using current sensing.

In one embodiment, a method for operating a non-volatile storage system includes applying a first voltage to a selected word line which is associated with at least a first non-volatile storage element, where the at least a first non-volatile storage element is provided in a set of non-volatile storage elements, applying source and p-well voltages to a source and a p-well, respectively, which are associated with the at least a first non-volatile storage element during at least a portion of a time in which the first voltage is applied, where the source and p-well voltages exceed the first voltage, and determining whether the at least a first non-volatile storage element is in a conductive state or a non-conductive state using current sensing while applying the first voltage and the source and p-well voltages.

In another embodiment, a method for operating a non-volatile storage system includes providing a potential of a drain associated with at least a first non-volatile storage element above a potential of a source associated with the at least a first non-volatile storage element, and applying positive voltages to the source and to a p-well associated with the at least a first non-volatile storage element while applying a positive voltage to a word line associated with the at least a first non-volatile storage element, where a level of the voltage applied to the word line is less than levels of the voltages applied to the source and p-well. The method further includes, while applying the voltages to the source, p-well and word line, performing current sensing with respect to a level of a current which flows through the at least a first non-volatile storage element and sinks into the source, and determining a programming condition of the at least a first non-volatile storage element according to the current sensing.

In another embodiment, a method for operating a non-volatile storage system includes first and second sensing operations. The first sensing operation includes applying a first voltage to a control gate of at least a first non-volatile storage element, where the at least a first non-volatile storage element is provided in a set of non-volatile storage elements, applying a source voltage to a source which is associated with the at least a first non-volatile storage element during at least a portion of a time in which the first voltage is applied, where the source voltage exceeds the first voltage, and determining whether the at least a first non-volatile storage element is in a conductive state or a non-conductive state using current sensing while applying the first voltage and the source voltage. The second sensing operation includes applying a second voltage to the control gate of the at least a first non-volatile storage element, applying the source voltage to the source during at least a portion of a time in which the second voltage is applied, and determining whether the at least a first non-volatile storage element is in a conductive state or a non-conductive state using current sensing while applying the second voltage and the source voltage.

BRIEF DESCRIPTION OF THE DRAWINGS

FIG. 6b depicts waveforms associated with FIG. 6a.

FIG. 6c depicts a sensing process associated with FIGS. 6a and 6b.

FIG. 6d depicts current sensing based on a change in voltage.

FIG. 8c depicts waveforms associated with FIGS. 8a and 8b.

FIG. 9a depicts a NAND string and components for temperature-compensated sensing.

FIG. 9d depicts waveforms associated with FIGS. 9a-c.

FIG. 9e depicts a sensing process associated with FIGS. 9a-d.

FIG. 9f depicts an erase-verify process.

DETAILED DESCRIPTION

The present invention provides a method for sensing negative threshold voltages of non-volatile storage elements using current sensing.

Figure 1:
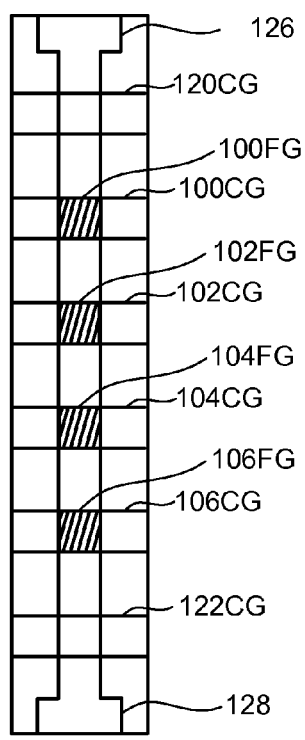
FIG. 1 is a top view of a NAND string.
Figure 2:
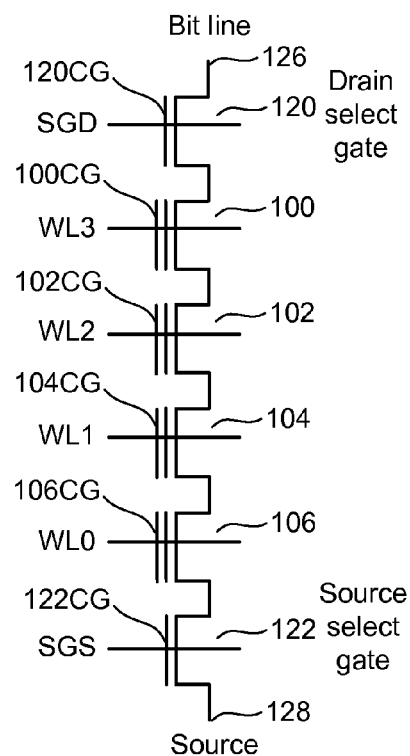
FIG. 2 is an equivalent circuit diagram of the NAND string of FIG. 1.

One example of a memory system suitable for implementing the present invention uses the NAND flash memory structure, which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate.

Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. The control gates can also be provided as portions of the word lines. In one embodiment, transistors 100, 102, 104 and 106 are each storage elements, also referred to as memory cells. In other embodiments, the storage elements may include multiple transistors or may be different than that depicted in FIGS. 1 and 2. Select gate 120 is connected to select line SGD (drain select gate). Select gate 122 is connected to select line SGS (source select gate).

Figure 3:
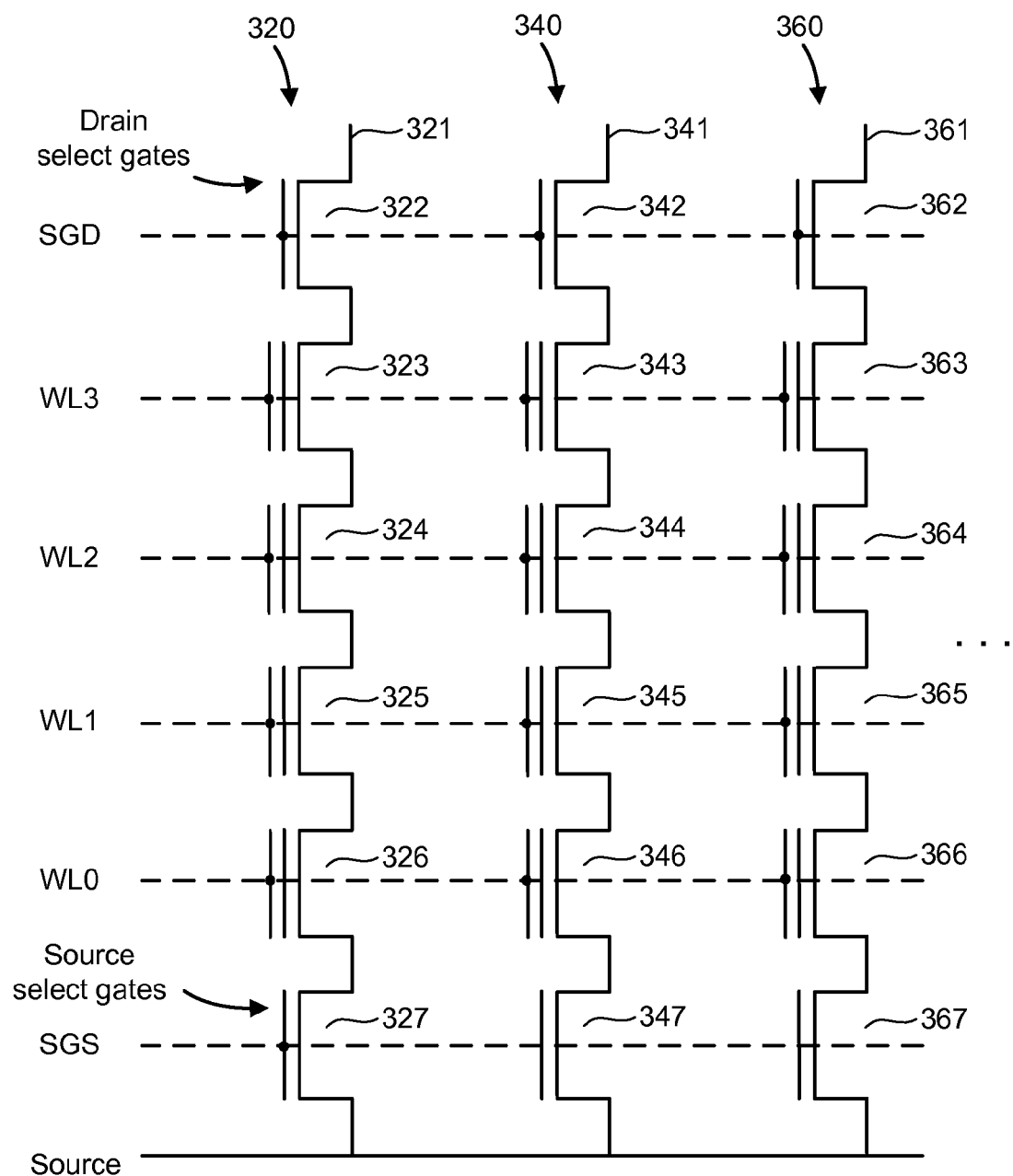
FIG. 3 is a block diagram of an array of NAND flash storage elements.

FIG. 3 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, etc. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements. For example, U.S. Pat. No. 6,222,762 and U.S. Patent Application Pub. 2004/0255090, both of which are incorporated herein by reference in their entirety, describe various data encoding schemes for multi-state flash storage elements.

Relevant examples of NAND type flash memories and their operation are provided in U.S. Pat. Nos. 5,386,422, 5,522, 580, 5,570,315, 5,774,397, 6,046,935, 6,456,528 and 6,522, 580, each of which is incorporated herein by reference.

When programming a flash storage element, a program voltage is applied to the control gate of the storage element and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 3, the program voltage will also be applied to the control gates of storage elements 344 and 364.

Figure 4:
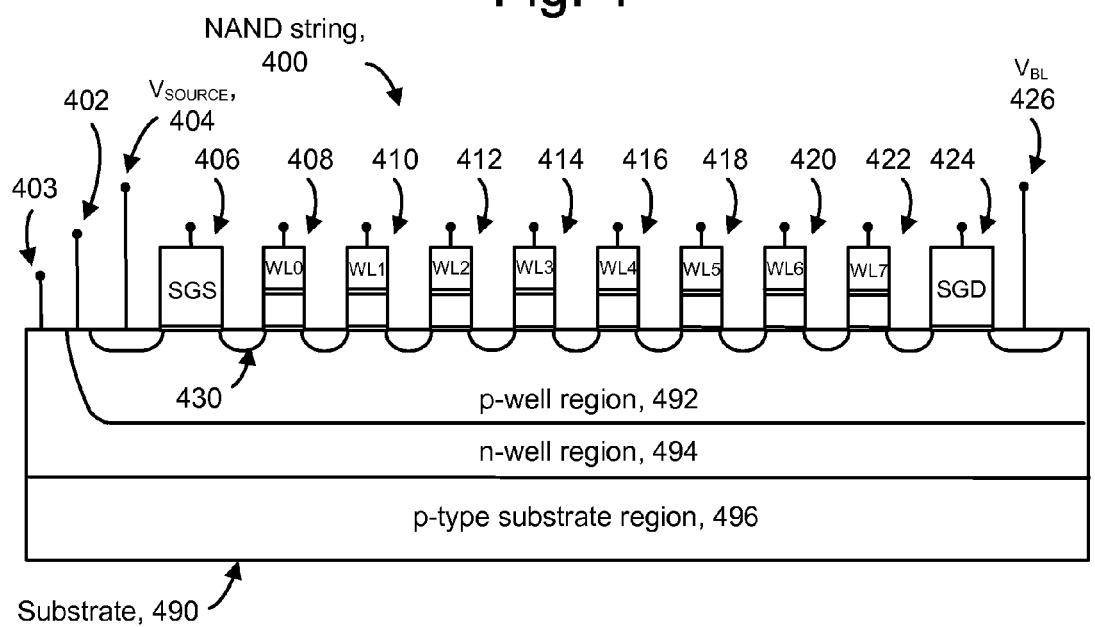
FIG. 4 depicts a cross-sectional view of a NAND string formed on a substrate.

FIG. 4 depicts a cross-sectional view of an NAND string formed on a substrate. The view is simplified and not to scale. The NAND string 400 includes a source-side select gate 406, a drain-side select gate 424, and eight storage elements 408, 410, 412, 414, 416, 418, 420 and 422, formed on a substrate 490. A number of source/drain regions, one example of which is source drain/region 430, are provided on either side of each storage element and the select gates 406 and 424. In one approach, the substrate 490 employs a triple-well technology which includes a p-well region 492 within an n-well region 494, which in turn is within a p-type substrate region 496. The NAND string and its non-volatile storage elements can be formed, at least in part, on the p-well region. A source supply line 404 with a potential of $V_{SOURCE}$ is provided in addition to a bit line 426 with a potential of $V_{BL}$. In one possible approach, a voltage can be applied to the p-well region 492 via a terminal 402. A voltage can also be applied to the n-well region 494 via a terminal 403.

During a read or verify operation, including an erase-verify operation, in which the condition of a storage element, such as its threshold voltage, is ascertained, $V_{CGR}$ is provided on a selected word line which is associated with a selected storage element. Further, recall that the control gate of a storage element may be provided as a portion of the word line. For example, WL0, WL1, WL2, WL3, WL4, WL5, WL6 and WL7 can extend via the control gates of storage elements 408, 410, 412, 414, 416, 418, 420 and 422, respectively. A read pass voltage, $V_{READ}$, can be applied to unselected word lines associated with NAND string 400, in one possible boosting scheme. Other boosting schemes apply $V_{READ}$ to some word lines and lower voltages to other word lines. $V_{SGS}$ and $V_{SGD}$ are applied to the select gates 406 and 424, respectively.

Figure 5A:
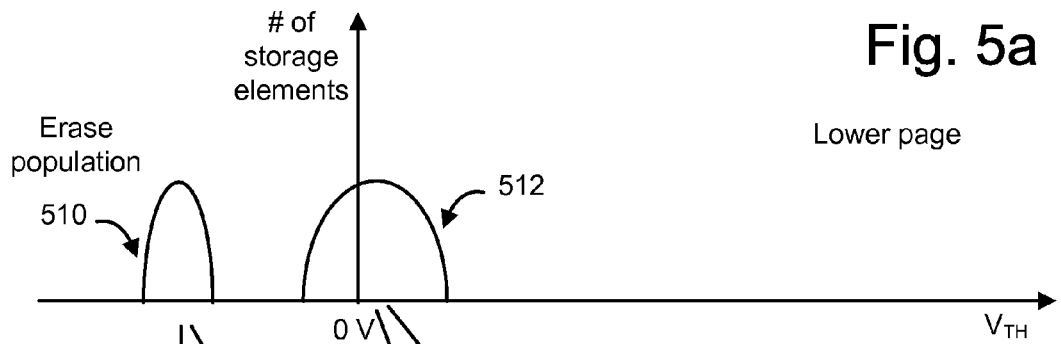
FIGS. 5a-d depict programming of a non-volatile storage element.
Figure 5B:
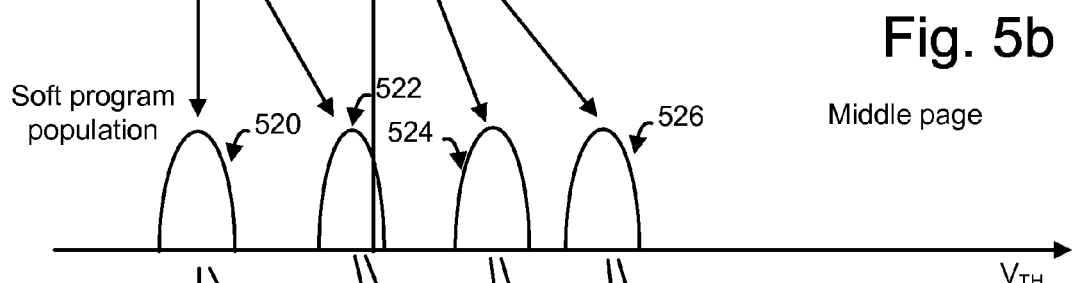
Figure 5C:
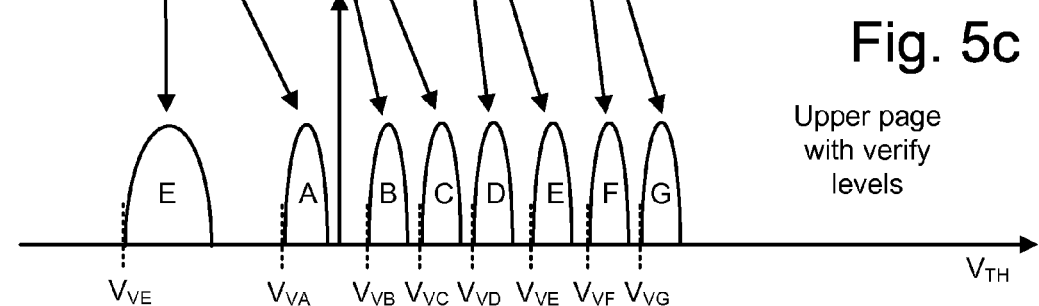

FIGS. 5a-d depict programming of a non-volatile storage element. In one possible programming technique, a lower page, middle page and upper page are programmed in three steps as depicted at FIGS. 5a, 5b and 5c, respectively. When programming the lower page of data after an erase operation, two $V_{TH}$ distributions 510 and 512 are provided. The lowest distribution 510 represents the erased state and has a negative $V_{TH}$. Next, the first and second $V_{TH}$ distributions 520 and 522, respectively, of FIG. 5b are obtained from the first $V_{TH}$ distribution 510 of FIG. 5a, and the third and fourth $V_{TH}$ distributions 524 and 526, respectively, of FIG. 5b are obtained from the second $V_{TH}$ distribution 512 of FIG. 5a. The first and second $V_{TH}$ distributions of FIG. 5c, representing the final erased state E and a first programmed state A, respectively, are obtained from the first $V_{TH}$ distribution 520 of FIG. 5b. The third and fourth $V_{TH}$ distributions of FIG. 5c, representing the second and third programmed states B and C, respectively, are obtained from the second $V_{TH}$ distribution 522 of FIG. 5b. The fifth and sixth $V_{TH}$ distributions of FIG. 5c, representing the fourth and fifth programmed states D and E, respectively, are obtained from the third $V_{TH}$ distribution 524 of FIG. 5b. The seventh and eight $V_{TH}$ distributions of FIG. 5c, representing the sixth and seventh programmed states F and G, respectively, are obtained from the fourth $V_{TH}$ distribution 526 of FIG. 5b. Further, code words 111, 011, 001, 101, 100, 000, 010 and 110 may be associated with the states E, A, B, C, D, E, F and G, respectively.

States E and A are examples of negative threshold voltage states. Depending on the implementation, one or more states can be negative threshold voltage states.

FIG. 5c also depicts verify voltages which are used to obtain the distributions indicated. Specifically, verify voltages $V_{VE}$, $V_{VA}$, $V_{VB}$, $V_{VC}$, $V_{VD}$, $V_{VE}$, $V_{VF}$ and $V_{VG}$ are associated with distributions E, A, B, C, D, E, F and G, respectively. During programming, the threshold voltages of storage elements which are to be programmed to a given distribution are compared to the associated verify voltage. The storage elements receive programming pulses via an associated word line until their threshold voltage is verified to have exceeded the associated verify voltage.

Figure 5D:
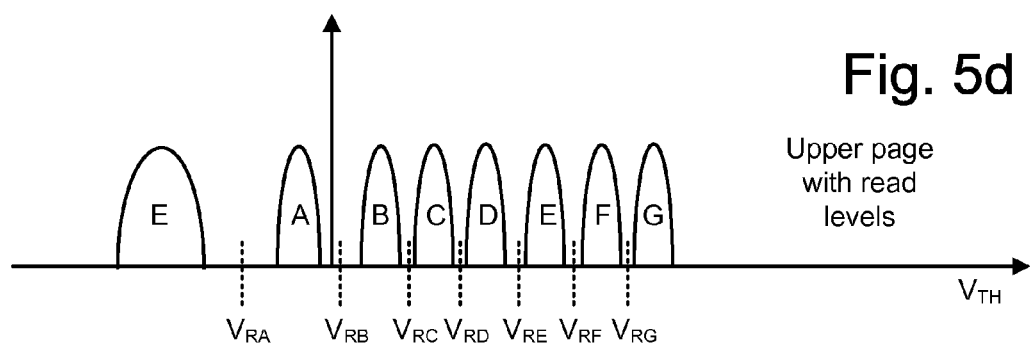

FIG. 5d depicts read voltages which are used to read the programming state of a storage element. Once the storage elements have been programmed, they can subsequently be read using read voltages $V_{RA}$, $V_{RB}$, $V_{RC}$, $V_{RD}$, $V_{RE}$, $V_{RF}$ and $V_{RG}$. One or more storage elements, typically associated with a common word line, are compared to each read voltage to determine whether their threshold voltage exceeds the read voltage. The state of the storage element can then be determined by the highest read voltage which is exceeded. The read voltages are provided between the neighboring states.

Note that the programming process depicted is one possible example as other approaches are possible.

Current Sensing of Negative Threshold Voltage

In non-volatile storage devices, including those using NAND memory designs, a satisfactory methodology has not been available to use current sensing for sensing negative threshold voltage states of non-volatile storage elements during read or verify operations. Voltage sensing has been used but has been found to take a long time to complete. Further, due to bit line-to-bit line capacitive coupling and other effects, voltage sensing has been unsuitable for all bit line sensing, in which sensing is performed on a group of adjacent storage elements concurrently. One possible solution involves regulating the source voltage and p-well voltage to some fixed, positive DC level during sensing when using current sensing, and connecting the control gate of the sensed storage element, via its associated word line, to a lower potential than the source and p-well voltage. It is also possible for the source voltage and p-well voltage to differ. With this methodology of combining biasing of the source and the p-well to some fixed potential, it is possible to sense one or more negative threshold voltage states using current sensing. Further, current sensing is compatible with all bit line sensing since it avoids many of the disadvantages of voltage sensing.

Figure 6A:
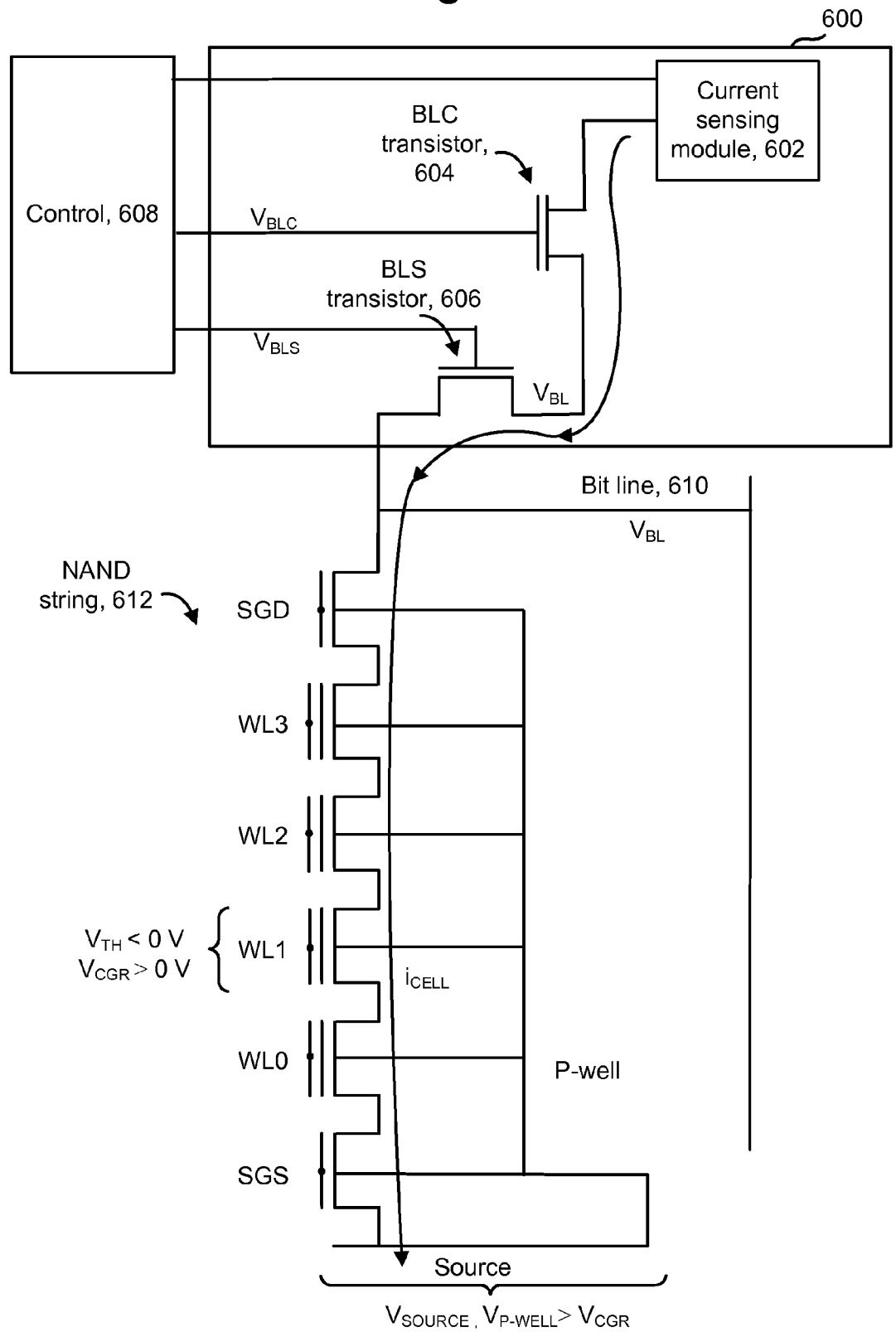
FIG. 6a depicts a configuration of a NAND string and components for sensing.

FIG. 6a depicts a configuration of a NAND string and components for sensing. In a simplified example, a NAND string 612 includes four storage elements which are in communication with word lines WL0, WL1, WL2 and WL3, respectively. In practice, additional storage elements and word lines can be used. Further, additional NAND strings are typically arranged adjacent to one another in a block or other set of non-volatile storage elements (see, e.g., FIG. 14). The storage elements are coupled to a p-well region of a substrate. A bit line 610 having a voltage $V_{BL}$ is depicted, in addition to sense components 600. In particular, a BLS (bit line sense) transistor 606 is coupled to the bit line 610. The BLS transistor 606 is a high voltage transistor, and is opened in response to a control 608 during sense operations. A BLC (bit line control) transistor 604 is a low voltage transistor which is opened in response to the control 608 to allow the bit line to communicate with a current sensing module 602. During a sense operation, such as a read or verify operation, a pre-charge operation occurs in which a capacitor in the current sensing module 602 is charged. The BLC transistor 604 may be opened to allow the pre-charging. Also during the sense operation, for a storage element having a negative threshold voltage state, a positive voltage is applied to a word line of one or more storage elements involved in the operation. The use of a positive voltage for the selected word line in a sensing operation in which a negative threshold voltage is sensed is advantageous since a negative charge pump is not needed to provide a negative word line voltage. The incorporation of a negative charge pump into many non-volatile storage systems would require substantial process study and modification.

For example, assume the selected word line is WL1. The voltage on WL1 is coupled to the control gates of the storage elements on the word line as the control gate read voltage $V_{CGR}$. Further, a positive voltage $V_{SOURCE}$ can be applied to the source side of the NAND string 630 and a positive voltage $V_{P\text{-}WELL}$ can be applied to the p-well. $V_{SOURCE}$ and $V_{P\text{-}WELL}$ are greater than $V_{CGR}$, in one implementation. $V_{SOURCE}$ and $V_{P\text{-}WELL}$ can differ from one another, or they can be coupled to the same DC voltage, $V_{DC}$. Further, $V_{DC} > V_{CGR}$. As an example, $V_{DC}$ can be in the range of about 0.4 to 1.5 V, e.g., 0.8 V. A higher $V_{DC}$ allows sensing of more negative threshold voltage states. For example, first and second negative threshold voltage states $V_{TH1} = -1.0$ V and $V_{TH2} = -0.5$ V might be sensed using $V_{DC} = 1.5$ V and $V_{DC} = 1.0$ V, respectively. $V_{DC}$ can be set at a level such that $V_{DC} - V_{TH} > 0$ V. Generally, for sensing a negative threshold voltage, the word line and source voltages are set so that the gate-to-source voltage is less than zero, i.e., $V_{GS} < 0$ V. The selected storage element is conductive if the gate-to-source voltage is greater than the storage element's threshold voltage, i.e., $V_{GS} > V_{TH}$. For sensing a positive threshold voltage, the source and p-well can be kept at the same voltage while the selected word line voltage is adjusted.

At the drain side of the NAND string 630, the BLS transistor 610 is turned on, e.g., made conductive or opened. Additionally, a voltage $V_{BLC}$ is applied to the BLC transistor 600 to make it conductive. The pre-charged capacitor in the current sensing module 602 discharges through the bit line and into the source so that the source acts as a current sink. The pre-charged capacitor at the drain of the NAND string may be pre-charged to a potential which exceeds a potential of the source so that a current flows through the selected non-volatile storage element and sinks into the source when the selected storage element is in the conductive state.

In particular, if the selected storage element is in a conductive state due to the application of $V_{CGR}$, a relatively high current will flow. If the selected storage element is in a non-conductive state, no or relatively little current will flow. The current sensing module 602 can sense the cell/storage element current, $i_{CELL}$. In one possible approach, the current sensing module determines a voltage drop which is tied to a fixed current flow by the relationship $\Delta V = i \cdot t/C$, where $\Delta V$ is the voltage drop, i is the fixed current, t is a predetermined discharge time period and C is the capacitance of the pre-charged capacitor in the current sensing module. See also FIG. 6d, which depicts voltage drop with time for different lines of fixed current. The greater voltage drops represent higher currents. At the end of a given discharge period, since i and C are fixed, $\Delta V$ for a given current can be determined. In one approach, a p-mos transistor is used to determine a level of $\Delta V$ relative to a demarcation value. In another possible approach, a cell current discriminator serves as a discriminator or comparator of current levels by determining whether the conduction current is higher or lower than a given demarcation current.

Voltage sensing, in contrast, does not involve sensing a voltage drop which is tied to a fixed current. Instead, voltage sensing involves determining whether charge sharing occurs between a capacitor in a voltage sensing module and a capacitance of the bit line. Current is not fixed or constant during the sensing. Little or no charge sharing occurs when the selected storage element is conductive, in which case the voltage of the capacitor in the voltage sensing module does not drop significantly. Charge sharing does occur when the selected storage element is non-conductive, in which case the voltage of the capacitor in the voltage sensing module does drop significantly.

The current sensing module 602 thus can determine whether the selected storage element is in a conductive or non-conductive state by the level of current. Generally, a higher current will flow when the selected storage element is in a conductive state and a lower current will flow when the selected storage element is in a non-conductive state. A threshold voltage of the selected storage element is above or below a compare level, such as a verify level (see FIG. 5c) or a read level (see FIG. 5d), when it is in a non-conductive state or a conductive state, respectively.

Figure 6B:
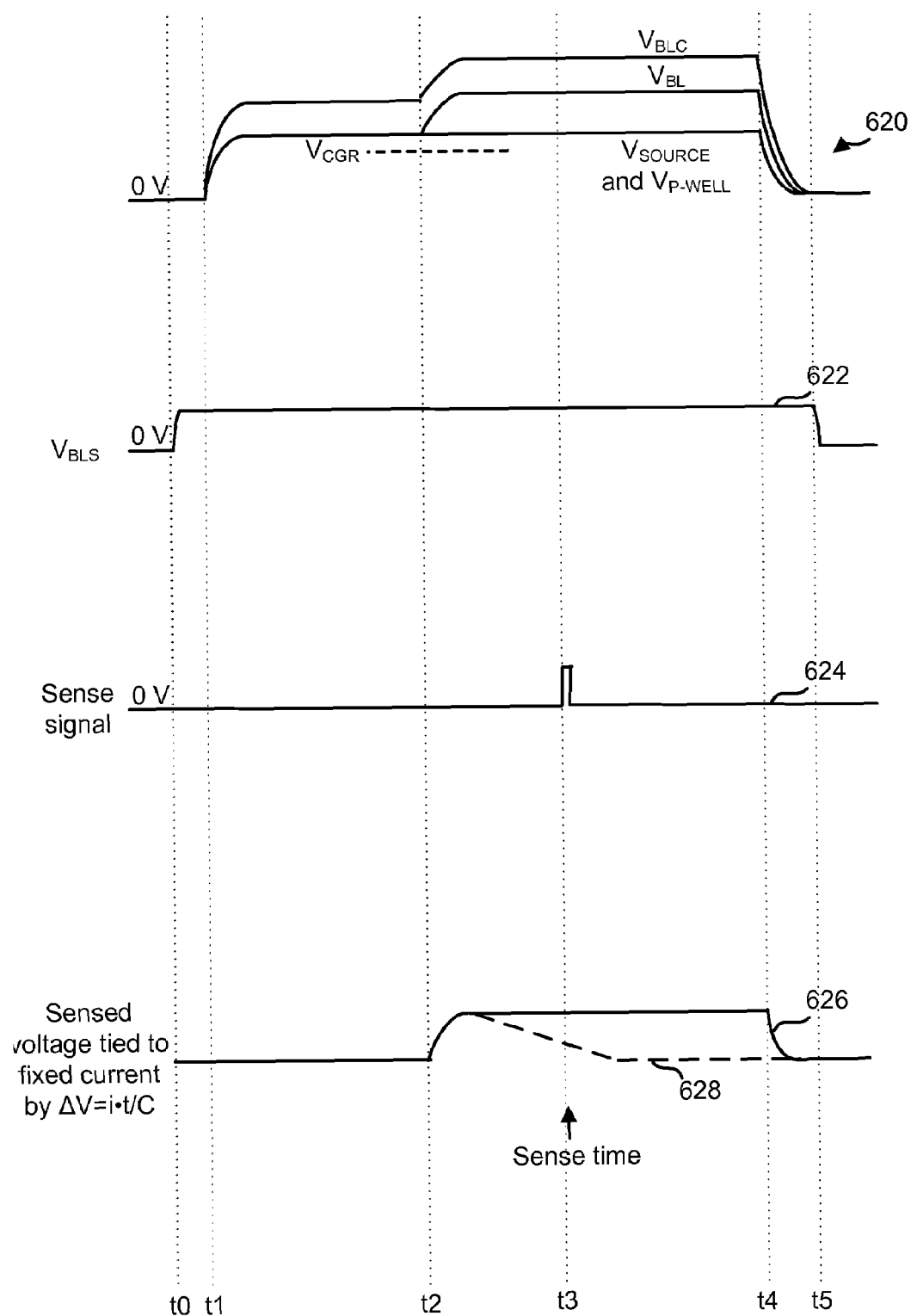

FIG. 6b depicts waveforms associated with FIG. 6a. Waveforms 620 depict $V_{SOURCE}$ and $V_{P\text{-}WELL}$, $V_{BL}$ and $V_{BLC}$. $V_{SOURCE}$ and $V_{P\text{-}WELL}$ are set at an elevated level at t1 during the sense operation. In one approach, such as when the sense operation involves a negative threshold voltage, $V_{SOURCE}$ and $V_{P\text{-}WELL}$ exceed $V_{CGR}$. However, $V_{SOURCE}$ and $V_{P\text{-}WELL}$ need not exceed $V_{CGR}$, e.g., when the sense operation involves a positive threshold voltage. $V_{BL}$ increases with $V_{SOURCE}$ between t1 and t2. At t2, the pre-charged capacitor is discharged, increasing $V_{BL}$. Thus, a potential of a drain (e.g., $V_{BL}$) associated with the selected non-volatile storage element is above a potential of a source (e.g., $V_{SOURCE}$) associated with the selected non-volatile storage element. $V_{BLC}$ tracks $V_{BL}$ but is slightly higher due to the threshold voltage of the BLC transistor. In practice, after rising, $V_{BL}$ will drop slightly (not shown) if current flows in the NAND string. For example, $V_{BL}$ may rise to 1 V when $V_{BLC}$=2 V and the threshold voltage of the BLC transistor is 1 V. When sensing, if current flows, $V_{BL}$ may drop from 1 V to 0.9 V, for instance. Waveform 622 depicts a voltage applied to the BLS transistor, indicating it is conductive between t0 and t5. Waveform 624 depicts a sense signal which is a control signal indicating the time t after the capacitor starts discharging in the current sensing module.

Waveforms 626 and 628 depict a sensed voltage which is tied to a fixed current for the selected bit line. A determination can be made at t3 as to whether the voltage exceeds a demarcation level. It can be concluded that the selected storage element is conductive when the voltage drops below the demarcation level (e.g., line 628). The selected storage element is non-conductive if the voltage does not drop below the demarcation level (e.g., line 626).

FIG. 6c depicts a sensing process associated with FIGS. 6a and 6b. An overview of the sensing process is provided. In this and the other flowcharts, the steps depicted do not necessary occur as discrete steps and/or in the sequence depicted. A sense operation, such as a read or verify operation, begins at step 640. Step 642 includes opening the BLS and BLC transistors to pre-charge the bit line. Step 644 includes setting the word line voltages. Step 646 includes setting $V_{SOURCE}$ and $V_{P\text{-}WELL}$. Step 648 includes determining whether the storage element is conductive or non-conductive using current sensing. If another sense operation is to be performed, at decision step 650, the control flow continues at step 640. Otherwise, the process ends at step 652.

Multiple sensing operations can be performed successively, for example, one for each verify or read level. In one approach, the same source and p-well voltages are applied in each sense operation, but the selected word line voltage is changed. Thus, in a first sensing operation, a first voltage can be applied to the control gate/word line of a selected storage element, the source voltage applied to the source, and the p-well voltage applied to the p-well. A determination is then made as to whether the storage element is in a conductive state or a non-conductive state using current sensing while applying the first voltage and the source voltage. A second sensing operation includes applying a second voltage to the control gate while applying the same source and p-well voltages. A determination is then made as to whether the storage element is in a conductive state or a non-conductive state. Successive sensing operations similarly can vary the selected word line voltage while using the same source and p-well voltages.

Further, sensing can be performed concurrently for multiple storage elements which are associated with a common word line and source. The multiple storage elements may be in adjacent or non-adjacent NAND strings. All bit line sensing, discussed previously, involves concurrent sensing of storage elements in adjacent NAND strings. In this case, the sensing includes determining, in concurrent sensing operations, whether each of the non-volatile storage elements is in the conductive or non-conductive state using current sensing.

Current Sensing with Biasing of Source and P-Well

In non-volatile storage devices including those using NAND memory designs, current sensing can be used for sensing threshold voltage states of non-volatile storage elements during read or verify operations. However, such current sensing has resulted in variations or "bouncing" of a source voltage, especially at a ground voltage. The degree of the bouncing depends on the level of current through the storage elements. Moreover, the bouncing can result in sensing errors. One method of controlling cell source bounce during sensing is to sense using at least two strobes. This can minimize the effect of cell source bounce. For example, with current sensing, a current in the NAND string of the selected storage element may be sensed at each strobe from a control. A relatively high or otherwise inaccurate bounce current may be present at the first strobe, while a lower current is present by the time of the second strobe, where the lower current more accurately represents the sensed state of the storage element. However, the need to use an additional strobe to wait for the current to settle down consumes additional current and sense time. See FIG. 7a, which depicts variations in current and voltage with time due to ground bounce during a sense operation.

Another technique is to couple the source to the gate and drain of the storage elements. However, this technique is complicated, requiring extra circuits, and causing some impact on die size and power consumption of the memory chip. Moreover, this technique might not work very well due to RC delays from the source to the gate of the storage elements.

One approach which generally avoids these disadvantages is to regulate the source and p-well to some fixed positive DC level, instead of to ground, during sensing. By keeping the source and p-well at the fixed DC level, bouncing in the source voltage is avoided, so we can sense data using just one strobe. As a result, sense time and power consumption are reduced. Further, there is no need for significant additional circuitry, so die size is not adversely impacted. It is also possible to ground the p-well while regulating the source voltage at a fixed, positive DC level. Regulating the source voltage to a fixed, positive DC level can be achieved more readily than regulating the source voltage to ground since the regulating circuit need only sense positive voltages. A voltage regulator typically works by adjusting its output based on a comparison of a monitored level, e.g., of the source, to an internal reference voltage. If the monitored level drops below the internal reference voltage, the voltage regulator can increase its output. Similarly, if the monitored level increases above the internal reference voltage, the voltage regulator can lower its output. A voltage regulator may use an op-amp, for instance. However, if the reference voltage is at ground, the voltage regulator generally cannot lower its output below 0 V if the monitored level becomes greater than 0 V. Moreover, the voltage regulator may not be able to distinguish monitored levels below 0 V. Regulating the source voltage to a fixed, positive DC level thus avoids ground bounce and can reduce current consumption and sense time. See FIG. 7b, which depicts reduced variations in current and voltage with source voltage regulated to a fixed, positive DC level during a sense operation.

Figure 7A:
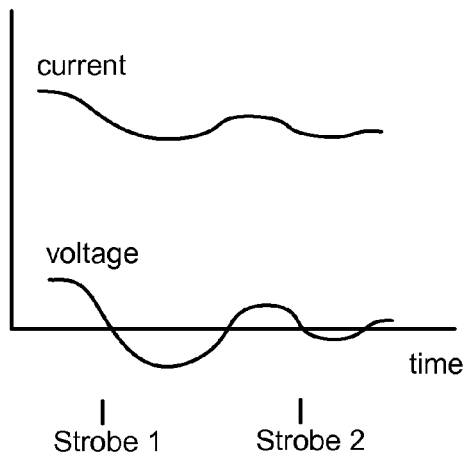
FIG. 7a depicts variations in current and voltage with time due to ground bounce during a sense operation.
Figure 7B:
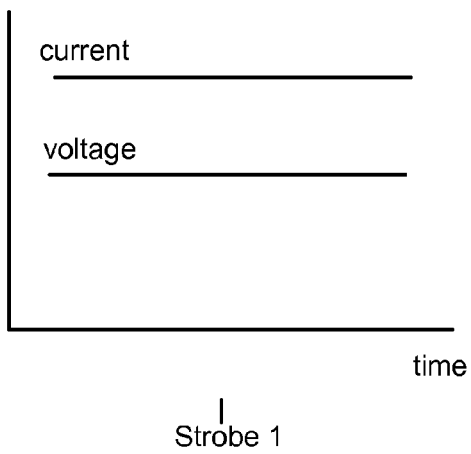
FIG. 7b depicts reduced variations in current and voltage with source voltage regulated to a fixed, positive DC level during a sense operation.
Figure 7D:
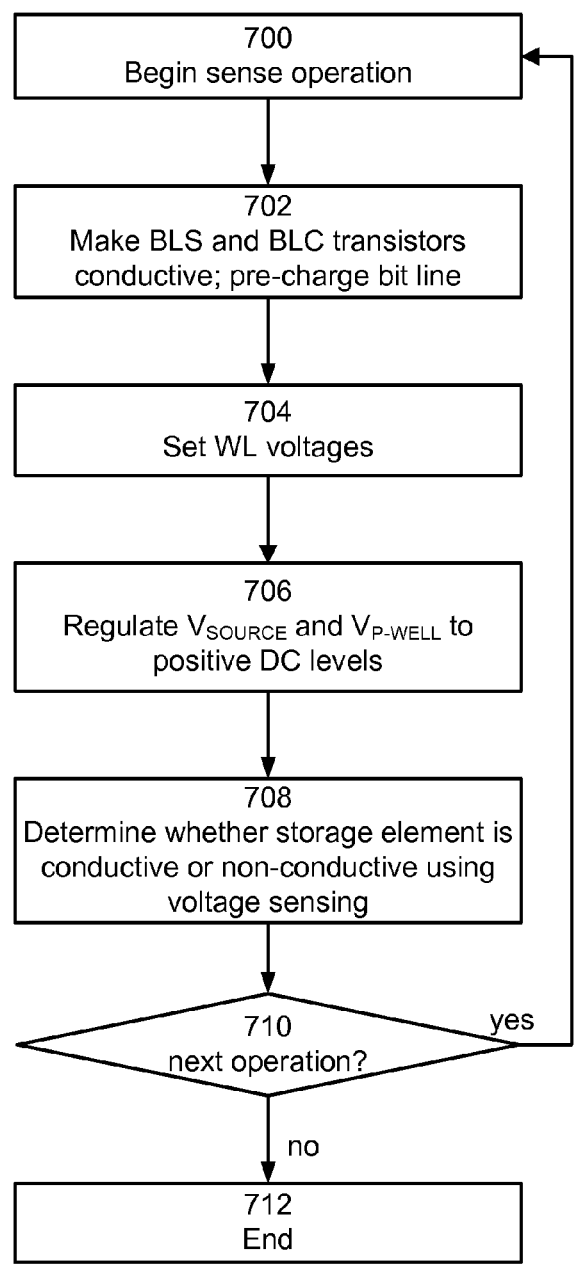
FIG. 7d depicts a sensing process associated with FIGS. 7a-7c.
Figure 7C:
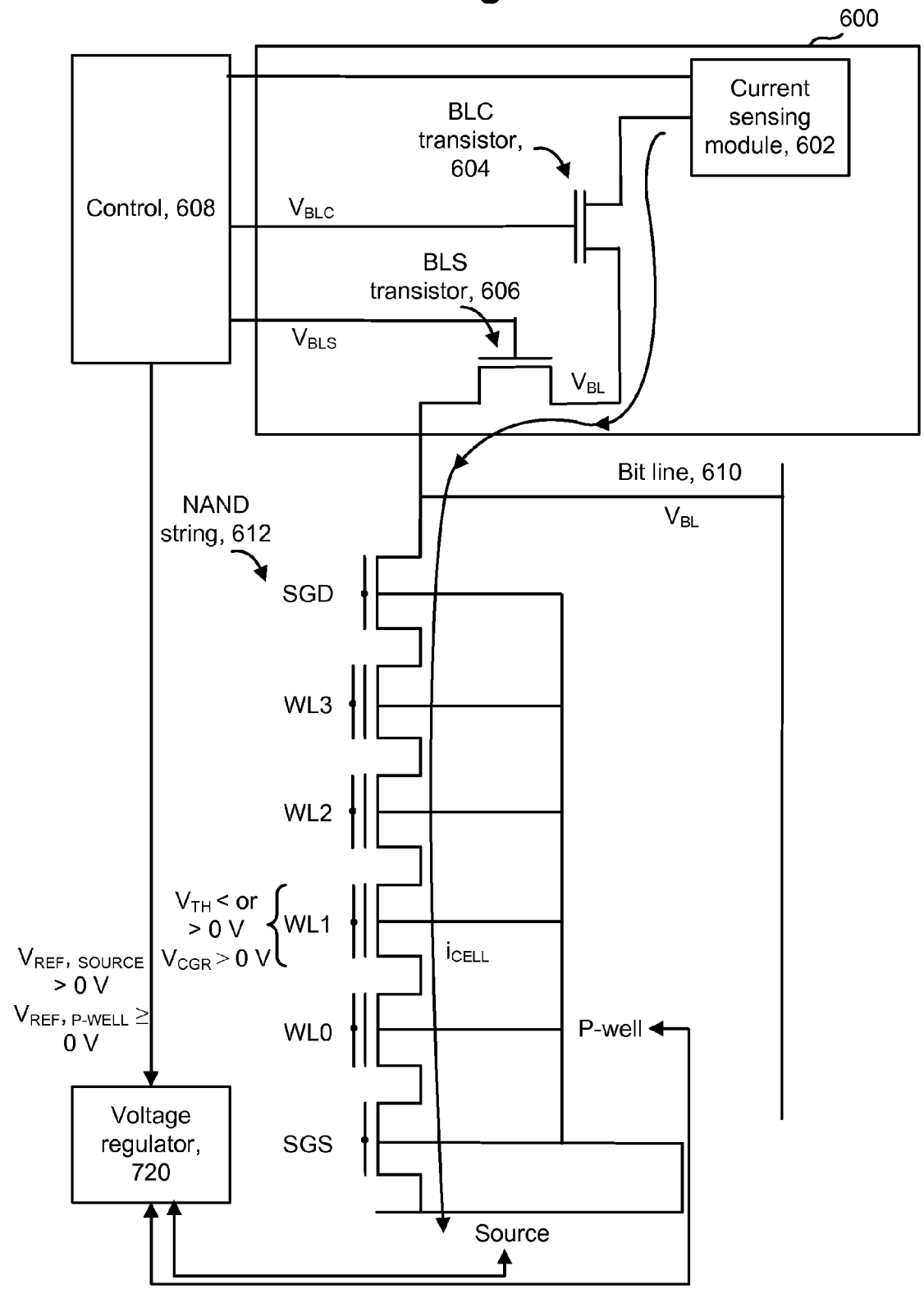
FIG. 7c depicts another configuration of a NAND string and components for sensing.

FIG. 7c depicts another configuration of a NAND string and components for sensing. The configuration corresponds to that provided in FIG. 6a except a voltage regulator 720 is depicted. As mentioned, the source voltage and p-well voltage can be regulated to a fixed, positive DC level during sense operations.

During a sense operation, such as a read or verify operation, of a storage element, a voltage is applied to a word line of one or more storage elements involved in the operation. For example, assume the selected word line is WL1. This voltage is coupled to the control gates of the storage elements on the word line as the control gate read voltage $V_{CGR}$. Further, a fixed DC voltage can be applied to the source side of the NAND string 612 as well as to the p-well as the source voltage $V_{SOURCE}$ and the p-well voltage $V_{P\text{-}WELL}$, respectively. When the threshold voltage is negative, $V_{CGR}$ can be positive, and $V_{SOURCE}$ and $V_{P\text{-}WELL}$ can be greater than $V_{CGR}$, in one implementation. When the threshold voltage is positive, $V_{CGR}$ can be greater than $V_{SOURCE}$ and $V_{P\text{-}WELL}$, in one implementation. $V_{SOURCE}$ and $V_{P\text{-}WELL}$ can differ from one another, or they can be coupled to the same DC voltage, $V_{DC}$. As an example, $V_{DC}$ can be regulated by the voltage regulator 720 to be in the range of about 0.4 to 1.2 V, e.g., 0.8 V. Due to the constant voltage on the source and p-well, accurate sensing can be achieved by using just one strobe, as discussed previously. Further, all bit line sensing can be performed in which storage elements associated with all bit lines are sensed (see FIG. 14). In particular, the voltage regulator 720 can receive a reference voltage, $V_{REF,SOURCE}$ which is used for regulating $V_{SOURCE}$ to a level greater than 0 V, and a reference voltage $V_{REF,P\text{-}WELL}$, which is used for regulating the p-well voltage to a level greater than or equal to 0 V.

FIG. 7d depicts a sensing process associated with FIGS. 7a-7c. A sense operation, such as a read or verify operation, begins at step 700. Step 702 includes opening the BLS and BLC transistors and pre-charging the bit line. Step 704 includes setting the word line voltages.

Step 706 includes regulating $V_{SOURCE}$ and $V_{P\text{-}WELL}$ to positive DC levels. Step 708 includes sensing whether the selected storage element is conductive or non-conductive using current sensing. If there is another sense operation, at decision step 710, the control flow continues at step 700. Otherwise, the process ends at step 712.

Further, as discussed previously, sensing can be performed concurrently for multiple storage elements which are associated with a common word line and source. The multiple storage elements may be in adjacent or non-adjacent NAND strings. In this case, the sensing includes determining, in concurrent sensing operations, whether each of the non-volatile storage elements is in the conductive or non-conductive state using current sensing. For each sensing operation, the voltages are regulated as discussed.

Source Bias All Bit Line Sensing

Figure 14:
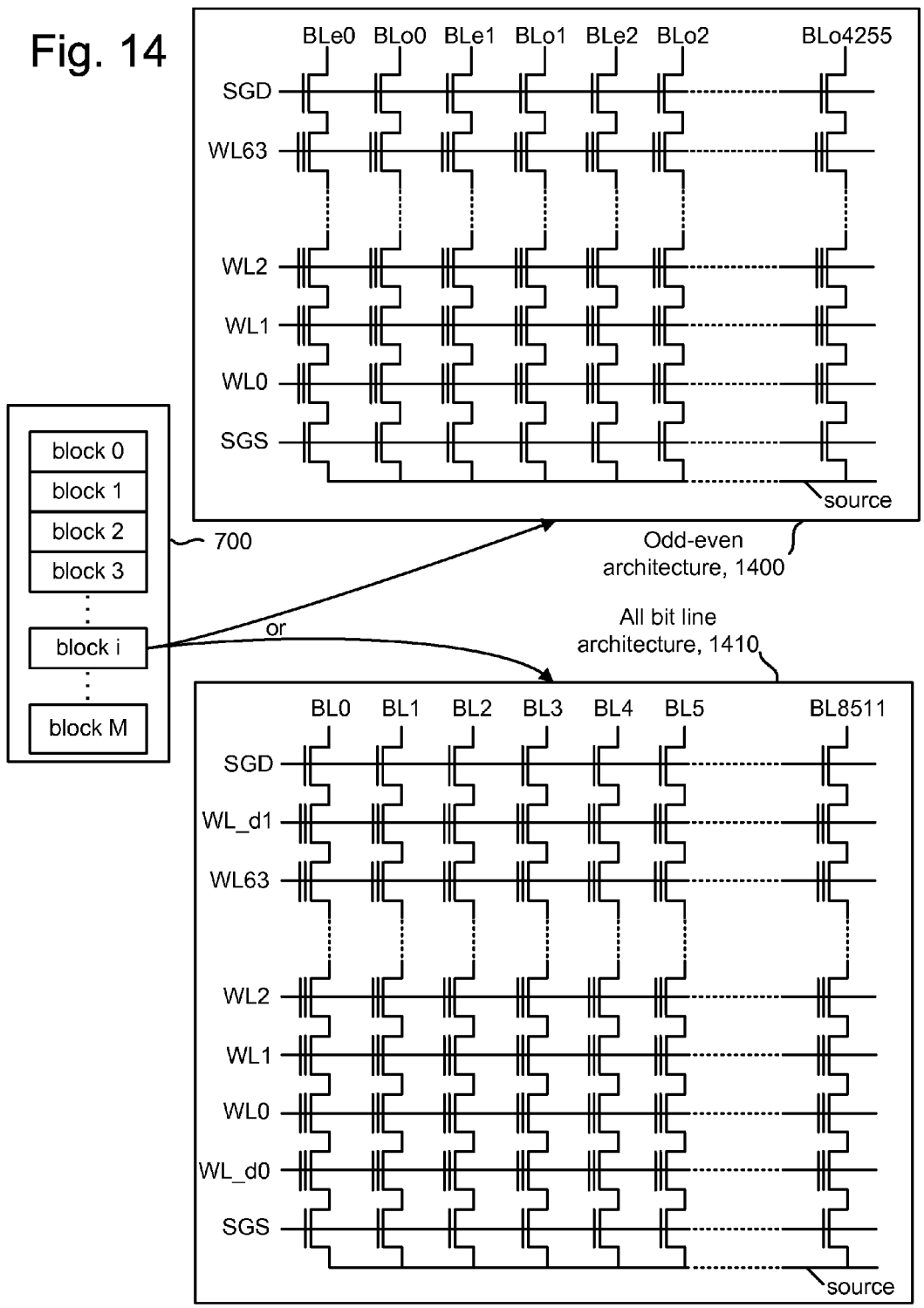
FIG. 14 depicts an example of an organization of a memory array into blocks for odd-even and all bit line memory architectures.

All bit line sensing involves performing sensing operations on storage elements in adjacent NAND strings (see FIG. 14). One potential sensing approach uses a DC storage element current to discharge charges on a fixed capacitance in a sensing module in a fixed period of time to convert the storage element's threshold voltage value into a digital data format. However, this requires a relatively large current sink into the source side of the NAND string. Further, as discussed previously, for sensing negative threshold voltage values, a bias can be applied to both the source and the p-well using an analog voltage level to avoid the need for negative word line voltages and a negative charge pump. However, since all bit line sensing is very sensitive to the source bias level, to maintain the analog voltage level requires a relatively large voltage regulator and an even distribution of the source voltage into the array. This can increase the require device area.

Another approach to all bit line sensing uses voltage sensing, discussed previously. This approach does not require a large voltage regulator because there is no DC current to the source side. However, this approach has not been able to successfully sense every bit line at the same time due to bit line-to-bit line coupling noise. Instead, only every alternative bit line is sensed at a given time, e.g., in odd-even sensing (see FIG. 14). Therefore, the performance in terms of sensing time has not been optimal. In particular, all bit line sensing has been problematic due to the close proximity of the adjacent NAND strings. Capacitive coupling can occur especially from NAND strings in which the selected storage element is conductive to NAND string in which the selected storage element is non-conductive. The bit line voltage of the NAND string in which the selected storage element is non-conductive is thereby increased, interfering with the sensing operation. This capacitive coupling is depicted by a capacitance to neighboring bit lines 813. The neighboring bit lines/NAND strings can be immediately adjacent or non-adjacent. Capacitive coupling from adjacent bit lines/NAND strings is strongest but some capacitively coupling from non-adjacent bit lines/NAND strings can also occur. A capacitance to ground 811 is also depicted.

Figure 8A:
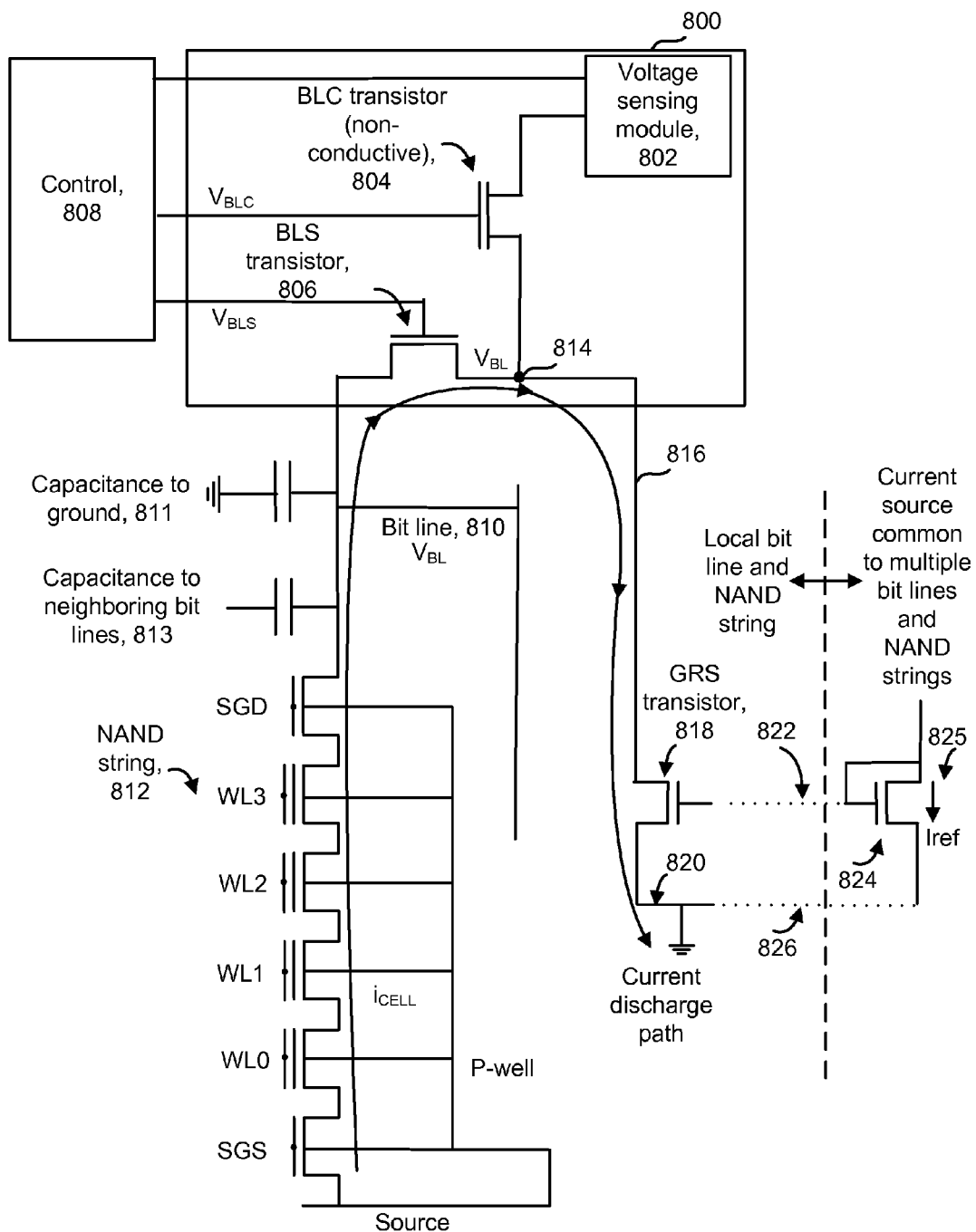
FIG. 8a depicts a configuration of a NAND string and components, including a current discharge path.

To overcome these issues, sensing can be performed using a scheme as depicted in FIG. 8*a*. FIG. 8*a* depicts a configuration of a NAND string and components, including a current discharge path. In a simplified example, a NAND string 812 includes four storage elements which are in communication with word lines WL0, WL1, WL2 and WL3, respectively. In practice, additional storage elements and word lines can be used. Further, additional NAND strings are typically arranged adjacent to one another in a block or other set of non-volatile storage elements. The storage elements are coupled to a p-well region of a substrate. A bit line 810 having a voltage $V_{BL}$ is depicted, in addition to sense components 800. In particular, a BLS (bit line sense) transistor 806, which is initially open or conductive, is coupled to the bit line 810 via a sense node 814. The BLS transistor 806 is a high voltage transistor, and is made conductive in response to a control 808 during sense operations. A BLC (bit line control) transistor 804, which is non-conductive initially, is a low voltage transistor which is opened in response to the control 808 to allow the bit line to communicate with a voltage sensing module/circuit 802. During a sense operation, such as a read or verify operation, a pre-charge operation occurs in which a capacitor in the voltage sensing module 602 is charged. The BLC transistor 804 may be opened to allow the pre-charging.

Further, a relatively weak current pull down device is introduced. In particular, a path 816, which is part of a current discharge path for the NAND string 812, is coupled to the sense node 814, which in turn is coupled to the bit line 810. A transistor, referred to as GRS transistor 818, is provided in a conductive state so that the path 816 is coupled to a path 820, which is also part of the current discharge path. A current source 825, e.g., current mirror, which provides a current of $i_{REF}$ is provided in parallel to the paths 816, 820 to pull the current $i_{CELL}$ on the paths down to ground. In an example, a relatively weak pull down is provided with an $i_{REF}$ of about 150 nA. However, the strength of the current source 825 can vary according to the specific implementation.

In one possible configuration, the current source 825 is common to multiple bit lines and NAND strings. In this case, a transistor 824 couples the current source 825 to the different NAND strings. A path 822 carries a control signal for the GRS transistor 818, which is local to a particular bit line and NAND string, while a path 826 is a common ground path for multiple bit lines.

During sensing, the bit line will charge up to a level which is based on the threshold voltage of the selected storage element, and a body effect. With a negative Vti, the storage element will be conductive even with a $V_{GCR}$=0 V. $V_{P-WELL}$ may be set to 0 V.

The transistors 818 and 824 are made conductive to create a current discharge path and pull down which serves to discharge any charge that is coupled to the NAND string 812 from one or more neighboring NAND strings due the capacitance to the neighboring bit line 813. Any extra charge that is generated by a neighboring bit line's coupling noise will therefore die out eventually. After a certain amount of time, all the bit lines reach their DC levels, and the BLC transistor 804 is turned on to allow charge sharing between the voltage sensing module 802 and the sense node 814 so that voltage sensing of the threshold voltage of the selected storage element can occur. The voltage sensing module 802 may perform voltage sensing as part of a reading or verifying operation, for instance.

Figure 8B:
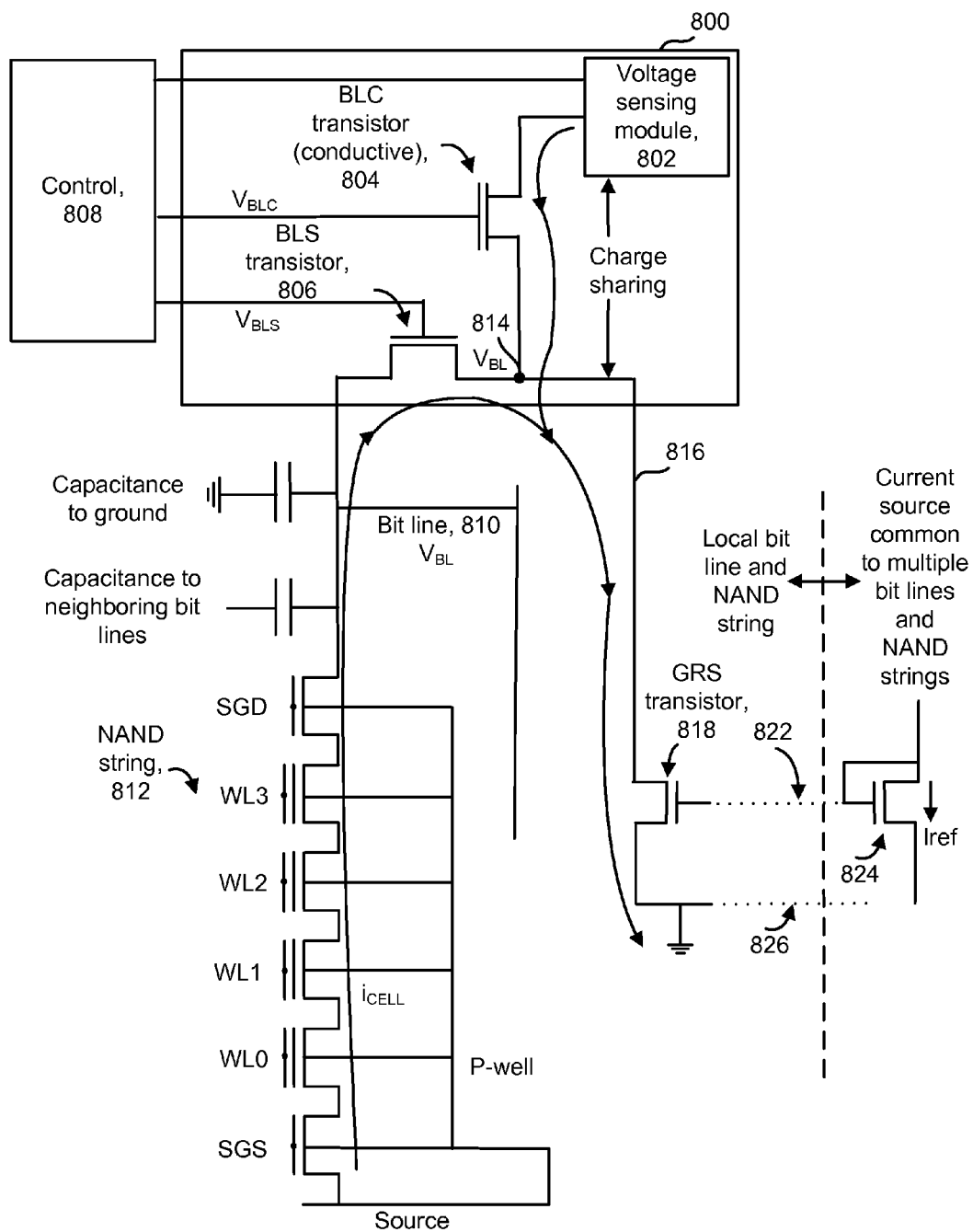
FIG. 8b depicts a configuration of the NAND string and components of FIG. 8a, when voltage sensing occurs.

FIG. 8*b* depicts a configuration of the NAND string and components of FIG. 8*a*, when voltage sensing occurs. Here, the BLC transistor 804 is opened so that current flows from the voltage sensing module 802 toward the discharge path in addition to the current being discharged from the NAND string 812. Thus, the GRS transistor remains in the conductive state so that discharging continues during the voltage sensing.

FIG. 8*c* depicts waveforms associated with FIGS. 8*a* and 8*b*. $V_{SOURCE}$ is depicted at waveform 830, and voltages on three adjacent bit lines BL0, BL1 and BL2 are depicted at waveforms 832, 834 and 836, respectively. A voltage $V_{BLS}$ on the BLS transistor is depicted at waveform 838, a voltage $V_{BLC}$ on the BLC transistor is depicted at waveform 840, and a voltage $V_{GRS}$ on the GRS transistor is depicted at waveform 842. A sensed voltage on BL0 and BL2 is depicted at waveform 844. A sensed voltage on BL1 is depicted at waveform 846 when the selected storage element on BL1 is conductive and at waveform 848 when the selected storage element on BL1 is non-conductive. As mentioned, during voltage sensing, charge sharing between the voltage sensing module and the bit line occurs when the selected storage element is non-conductive. This charge sharing lowers the sensed voltage at the voltage sensing module. Little or no charge sharing between the voltage sensing module and the bit line occurs when the selected storage element is conductive so that the sensed voltage at the voltage sensing module remains high. The sensed voltages at other times are not depicted as sensing does not occur.

At t0, $V_{BLS}$ increases so that the BLS transistor is conductive. At t1, $V_{SOURCE}$ is applied as a common source voltage for a set of NAND strings. In this example, we assume that the selected storage element associated with BL1 is non-conductive while the selected storage elements associated with BL0 and BL2 are conductive. BL0 is adjacent to BL1 on one side and BL2 is adjacent to BL1 on the other side (See FIG. 14). With the increase in $V_{SOURCE}$ at t1, $V_{BL0}$ and $V_{BL2}$ will rise as depicted by waveforms 832 and 836, respectively, causing capacitive coupling to BL1, as depicted by the transient increase in $V_{BL1}$. This coupling will substantially die out by t2. The GRS transistor for BL1 remains conductive between t1 and t5 to allow the bit line to discharge the coupled charge, as discussed.

At t3, the BLC transistor is opened by increasing $V_{BLC}$ as depicted by waveform 840, thereby allowing sensing to occur for the selected storage element on BL1. Note that corresponding components associated with BL0, BL2 and other bit lines can be controlled similarly to allow sensing to occur concurrently on those other bit lines. For BL1, the sensed voltage at the voltage sensing module will drop as depicted by waveform 846 if the selected storage element is non-conductive. On the other hand, the sensed voltage will remain generally high as depicted by waveform 844 if the selected storage element is conductive. The voltage sensing components may use a voltage break point at a specified sense time t4 to determine whether the selected storage element is conductive or non-conductive. As mentioned, if the sensed voltage exceeds the breakpoint, this indicates the storage element is open, while if the sensed voltage drops below the breakpoint, this indicates the storage element is non-conductive. $V_{SOURCE}$ is lowered at t5 and the BLS transistor is non-conductive at t6, indicating the end of the sense operation. $V_{P-WELL}$ may be set at 0 V during the sensing, in one possible approach. The selected word line receives $V_{CGR}$ while the unselected word lines can receive read pass voltages according to the particular sensing scheme.

Thus, after the source voltage is applied at t1, a predetermine delay of duration t3-t1 is instituted to allow sufficient time for the capacitive coupling from neighboring bit lines to be fully or at least partly discharged. The appropriate delay can be set as required for particular implementations based on theoretical and/or experimental tests. After the delay, voltage sensing occurs. At the specified time t4, a determination is made as to whether the storage element is in a conductive or non-conductive state and, therefore, has a threshold voltage which is below or above, respectively, a verify or read compare level.

Figure 8D:
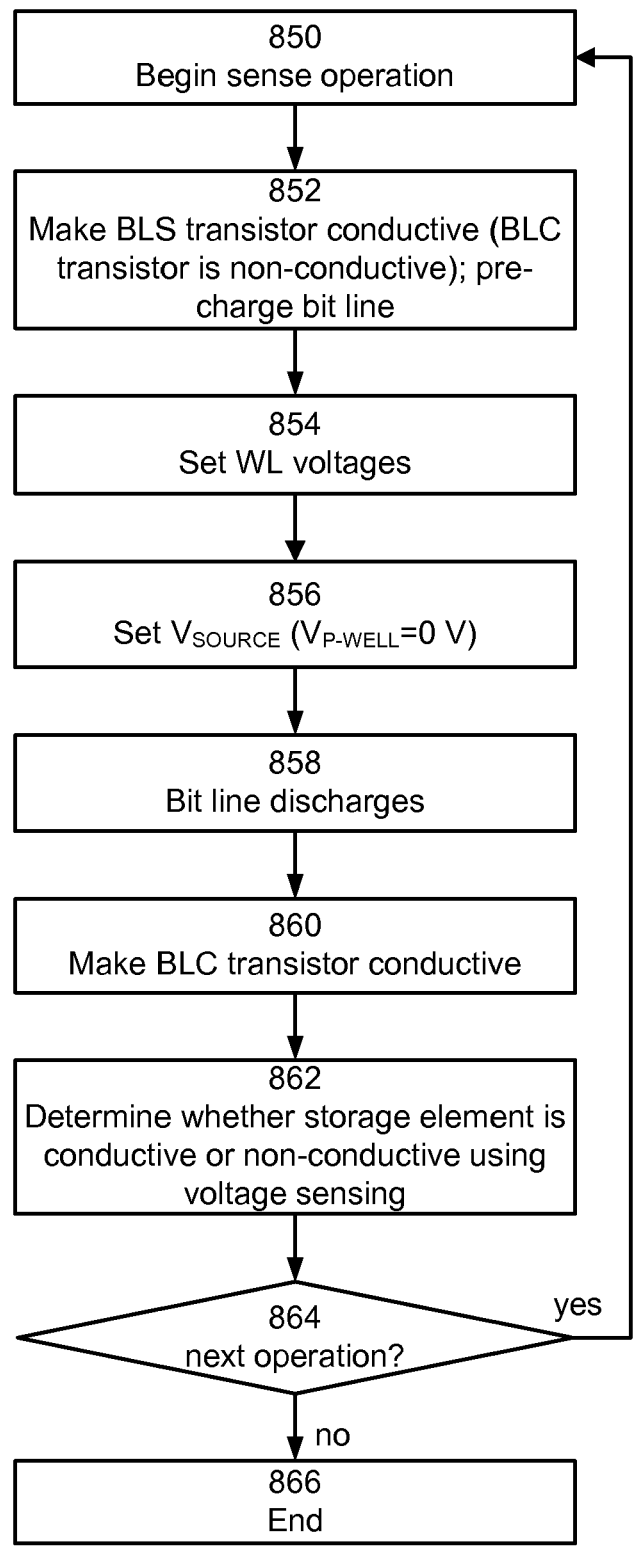
FIG. 8d depicts a sensing process associated with FIGS. 8a-8c.

FIG. 8d depicts a sensing process associated with FIGS. 8a-8c. At step 850, a sense operation begins. At step 852, the BLS transistor is opened while the BLC transistor remains non-conductive, and the bit line is pre-charged. At step 854, the word line voltages are set. At step 856, $V_{SOURCE}$ and $V_{P\text{-}WELL}$ are set ($V_{P\text{-}WELL}$=0 V). At step 858, bit line discharges. At step 860, the BLC transistor is made conductive to allow sensing to occur. At step 862, a determination is made as to whether the selected storage element is conductive or non-conductive using voltage sensing. If there is another sense operation, at decision step 864, the control flow continues at step 850. Otherwise, the process ends at step 868.

Further, as discussed previously, sensing can be performed concurrently for multiple storage elements which are associated with a common word line and source. The multiple storage elements may be in adjacent or non-adjacent NAND strings. In this case, the sensing includes determining, in concurrent sensing operations, whether each of the non-volatile storage elements is in the conductive or non-conductive state using current sensing. The delay before the BLC transistor is opened can be instituted for each NAND string so that the NAND strings can discharge as needed before sensing occurs.

Temperature Compensating Bit Line During Sense Operations

In present non-volatile storage devices, such as NAND flash memory devices, temperature variations present various issues in reading and writing data. A memory device is subject to varying temperatures based on the environment in which it is located. For example, some current memory devices are rated for use between −40° C. and +85° C. Devices in industrial, military and even consumer applications may experience significant temperature variations. Temperature affects many transistor parameters, the dominant among which is the threshold voltage. In particular, temperature variations can cause read errors and widen the threshold voltage distributions of the different states of a non-volatile storage element. An improved technique for addressing temperature effects in non-volatile storage devices is discussed below.

FIG. 9a depicts a NAND string and components for temperature-compensated sensing. Like numbered components correspond to those provided in FIG. 8a. The current discharge path of FIG. 8a is not depicted here. However, it is possible for the configuration of FIG. 8a to be combined with the configuration of FIG. 9a or some of the other figures provided herein. In addition, a temperature-dependent circuit 900 is provided as part of the control 808 to provide a temperature compensated voltage to the BLC transistor 804. The BLC transistor 804 has one node which is coupled to the voltage sensing module 802 and another node which is coupled to a drain or bit line which is associated with the NAND string 812 or other set of non-volatile storage elements.

During a sense operation, a voltage $V_{BLC}$ is applied to the BLC transistor 600, which couples the bit line or drain side of the NAND string 812 to the voltage sense module 802. In accordance with the approach herein, $V_{BLC}$ is set based on temperature to cancel out, or compensate for, variations in $V_{BL}$ with temperature. Specifically, $V_{BLC}=V_{BL}+V_{TH}$ (temperature-independent)+$\Delta V$, where $\Delta V$ is a voltage change due to temperature. $V_{BL}$ is also changed by $\Delta V$ due to temperature. Thus, $V_{BLC}$ can be controlled so that it varies with temperature in accordance with the variations in $V_{BLC}$. In particular, $\Delta V$ on the bit line can be matched to the $\Delta V$ of $V_{BLC}$ by using the temperature-dependent circuit 900. A current $i_{CELL}$ flows in the NAND string 812. The dotted line denotes charge sharing.

Figure 9B:
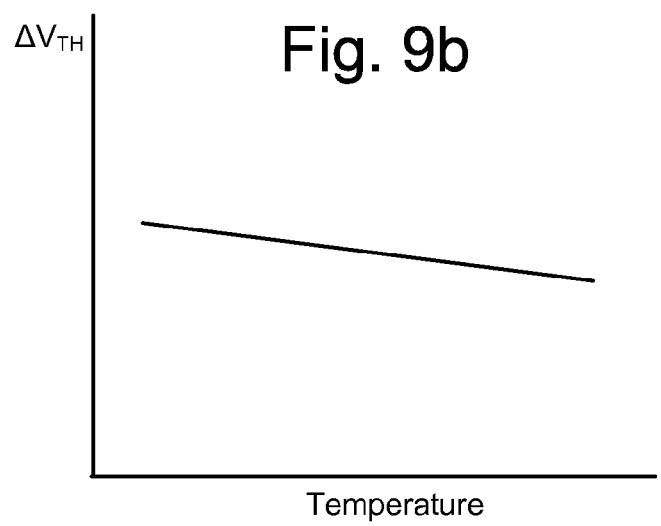
FIG. 9b illustrates a threshold voltage change with temperature.

FIG. 9b illustrates a threshold voltage change with temperature, e.g., $\Delta V_{TH}/°$ C. Typically, the threshold voltage of a non-volatile storage element decreases as temperature increases. The change in voltage relative to the change in temperature can be expressed in terms of a temperature coefficient which is typically about −2 mV/° C. The temperature coefficient depends on various characteristics of the memory device, such as doping, layout and so forth. Moreover, the temperature coefficient is expected to increase in magnitude as memory dimensions are reduced.

Various techniques are known for providing temperature-compensated signals generally. One or more of these techniques can be used in the temperature-dependent circuit 900, for instance. Most of these techniques do not rely on obtaining an actual temperature measurement, although this approach is also possible. For example, U.S. Pat. No. 6,801,454, titled "Voltage Generation Circuitry Having Temperature Compensation," incorporated herein by reference, describes a voltage generation circuit which outputs read voltages to a non-volatile memory based on a temperature coefficient. The circuit uses a band gap current which includes a temperature-independent portion and a temperature-dependent portion which increases as temperature increases. U.S. Pat. No. 6,560,152, titled "Non-Volatile Memory With Temperature-Compensated Data Read", incorporated herein by reference, uses a bias generator circuit which biases a voltage which is applied to a source or drain of a data storage element. U.S. Pat. No. 5,172,338, titled "Multi-State EEPROM Read and Write Circuits and Techniques", incorporated herein by reference, describes a temperature-compensation technique which uses reference storage cells that are formed in the same manner as data storage cells and on the same integrated circuit chip. The reference storage cells provide reference levels against which measured currents or voltages of the selected cells are compared. Temperature compensation is provided since the reference levels are affected by temperature in the same manner as the values read from the data storage cells. Any of the these techniques, as well as any other known techniques, can be used to provide a temperature-compensated voltage to a bit line control line as described herein.

$V_{BLC}$, as discussed, is a voltage of a control signal or voltage provided to the BLC transistor 804, which allows a sense component to sense the $V_{TH}$ of a selected storage element which is undergoing an erase-verify or other sensing operation. The sensing occurs via a bit line of a NAND string in which the selected storage element is located. In an example implementation, $V_{BLC}=V_{BL}+V_{TH}$ (BLC transistor). Thus, the control is configured to increase $V_{BLC}$ with increasing temperature to track the increase in $V_{BL}$. For a given $V_{TH}$ of a storage element, $V_{BL}$ will increase with temperature.

Figure 9C:
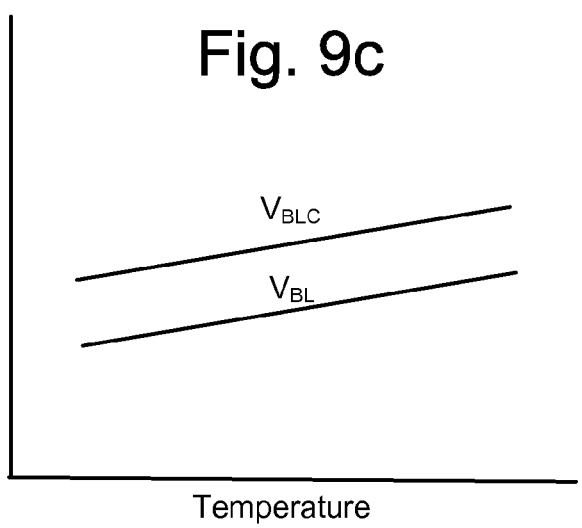
FIG. 9c illustrates a change in $V_{BLC}$ and $V_{BL}$ with temperature.

FIG. 9c illustrates a change in $V_{BLC}$ and $V_{BL}$ with temperature. The figure depicts how $V_{BLC}$ is increased with temperature to track the increase in $V_{BL}$. A control curve which provides specific changes in $V_{BLC}$ versus temperature can be programmed into the control 808 according to the specific implementation based on theoretical and experimental results. Generally, as the $V_{TH}$ of a storage element decreases with higher temperatures, the bit line voltage increases. This means $V_{BLC}$ should be higher in order for the voltage sensing module 802 to sense the higher $V_{BL}$. Note that the $V_{TH}$ of the storage element dictates $V_{BL}$. However, changing $V_{BLC}$ changes the voltage that the voltage sensing module senses so that the voltage is temperature compensated. Further, note that changes in the $V_{TH}$ of the BLC transistor 804 can be cancelled out by providing a transistor in the temperature-dependent circuit 900 which varies with temperature similar to the BLC transistor 804.

FIG. 9d depicts waveforms associated with FIGS. 9a-c. Waveform 910 depicts $V_{SOURCE}$ and $V_{P-WELL}$, which are set at an elevated level at t1 during the sense operation. Waveforms 912 and 914 depict an increase in $V_{BL}$ due to the application of $V_{SOURCE}$ and $V_{P-WELL}$. The higher level of $V_{BL}$ at a higher temperature is depicted by waveform 912 versus waveform 914. In practice, after rising, $V_{BL}$ may drop slightly (not shown) when current flows in the NAND string. Waveform 916 depicts a voltage applied to transistor BLS, indicating that it is turned on at t0. Waveforms 918 and 920 depict voltages applied to transistor BLC at higher and lower temperatures, respectively. Note that the waveforms provided are for the temperature compensation scheme in combination with the scheme of FIGS. 8a-d, where the opening of the BLC transistor is delayed to allow discharging to occur before sensing. However, the temperature compensation scheme is not required to be used in this way, and may be used in other implementations which do not involve a discharge path and/or a delay in sensing.

Waveform 922 depicts a sensed voltage in the voltage sensing module for the selected bit line when the selected storage element is open, while waveform 924 depicts a sensed voltage when the selected storage element is non-conductive. A determination can be made at t2 as to whether the sensed voltage exceeds a breakpoint. It can be concluded that the selected storage element is conductive or non-conductive when the sensed voltage exceeds the breakpoint or falls below the breakpoint, respectively.

FIG. 9e depicts a sensing process associated with FIGS. 9a-d. A sense operation, such as a read or verify operation, begins at step 930. Step 932 includes making the BLS and BLC transistors conductive, pre-charging the bit line, and setting a temperature dependent $V_{BLC}$. Step 934 includes setting the word line voltages, which are optionally temperature dependent. In one approach, only the selected word line voltage is temperature-dependent while in other approaches some or all of the word line voltages are temperature dependent. The word line voltages can be decreased with increasing temperatures in accordance with the decrease in $V_{TH}$ (See FIG. 9b). Step 936 includes setting $V_{SOURCE}$ and $V_{P-WELL}$. Step 938 includes determining whether the selected storage element is conductive or non-conductive using voltage sensing. If another sense operation is to be performed, at decision step 940, the control flow continues at step 930. Otherwise, the process ends at step 942.

Note that the drain or bit line of a NAND string communicates with the drain of the selected storage element since the storage elements on the drain side of the selected storage element are in a conductive state due to the sufficiently high voltages on the associated word lines. Similarly, the source of a NAND string communicates with the source of the selected storage element since the storage elements on the source side of the selected storage element are in a conductive state due to the sufficiently high voltages on the associated word lines. Thus, a voltage of the drain or bit line of a NAND string is also essentially the voltage of the drain of the selected storage element, and a voltage of the source of a NAND string is also essentially the voltage of the source of the selected storage element. Also, it is not necessary for the storage element being sensed to be in a NAND string or other set of storage elements as the technique described herein can be used with a single storage element.

Further, as discussed previously, sensing can be performed concurrently for multiple storage elements which are associated with a common word line and source.

Moreover, from the perspective of the control 808, the sensing process involves receiving information from the temperature-dependent circuit 900, and, responsive to the information, providing a temperature-compensated voltage to a control gate of the BLC transistor, which couples a NAND string or other set of non-volatile storage elements to a sense circuit. The control can also set the word line, source and p-well voltages, as well as receive information from the voltage sensing module 802 regarding the sensed programming condition of the selected storage element.

FIG. 9f depicts an erase-verify process. Step 950 includes erasing a set of storage elements. Step 952 includes beginning soft programming of one or more of the storage elements to a desired erase state, for instance. Soft programming generally involved applying voltage pulses to the selected word line to raise the threshold voltage of one or more the storage elements on the selected word line. The voltage pulses may be soft programming pulses which are lower in amplitude than those used for programming to higher states (step 954). This type of programming may be used, e.g., when the storage elements undergo a deep erase to ensure that their threshold voltages are all below the threshold voltage of the desired erased state. Step 956 includes verifying a programming condition of the storage elements, e.g., relative to the desired erased state. For example, this can include performing steps 932-938 of FIG. 9e, discussed above. If the soft programming is to be continued, at decision step 958, e.g., when the storage element has not reached the desired erase state, the control flow continues at step 954. Otherwise, the process ends at step 960.

Further, the erase-verify operation can be performed concurrently for multiple storage elements which are associated with a common word line and source.

Figure 10A:
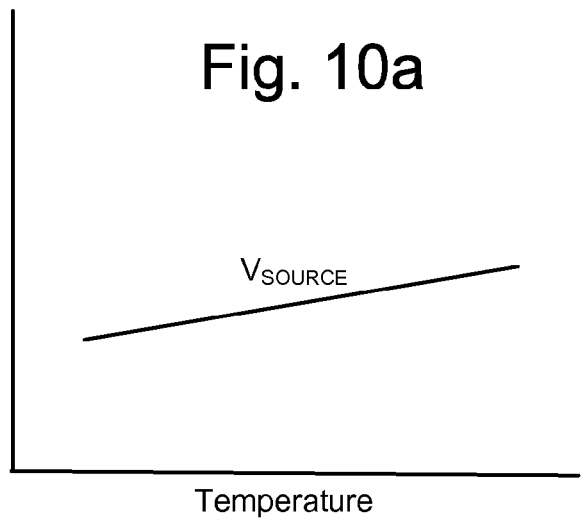
FIG. 10a illustrates a change in $V_{SOURCE}$ with temperature.

FIG. 10a illustrates a change in $V_{SOURCE}$ with temperature. In another approach, $V_{SOURCE}$ is temperature compensated, e.g., so that it increases with temperature. Generally, $V_{WL} = V_{SOURCE} + V_{TH}$ (selected storage element), where $V_{WL}$ is the voltage applied to the selected word line. As discussed, $V_{TH}$ decreases with temperature. Thus, with $V_{WL}$ fixed, $V_{SOURCE}$ can be set to increase with temperature to avoid temperature biases during sensing. Further, in one possible implementation, a constraint may be placed so that $V_{SOURCE}$ is increased only to positive values. For example, if $V_{SOURCE} = 0$ V at a baseline temperature, and the temperature increases, $V_{SOURCE}$ remains at 0 V. If the temperature decreases, $V_{SOURCE}$ increases according to the temperature coefficient. On the other hand, if $V_{SOURCE} > 0$ V at a baseline temperature, and the temperature increases, $V_{SOURCE}$ can decrease to a value which is greater than or equal to 0 V, i.e., a non-negative value. If the temperature decreases, $V_{SOURCE}$ increases according to the temperature coefficient.

Figure 10B:
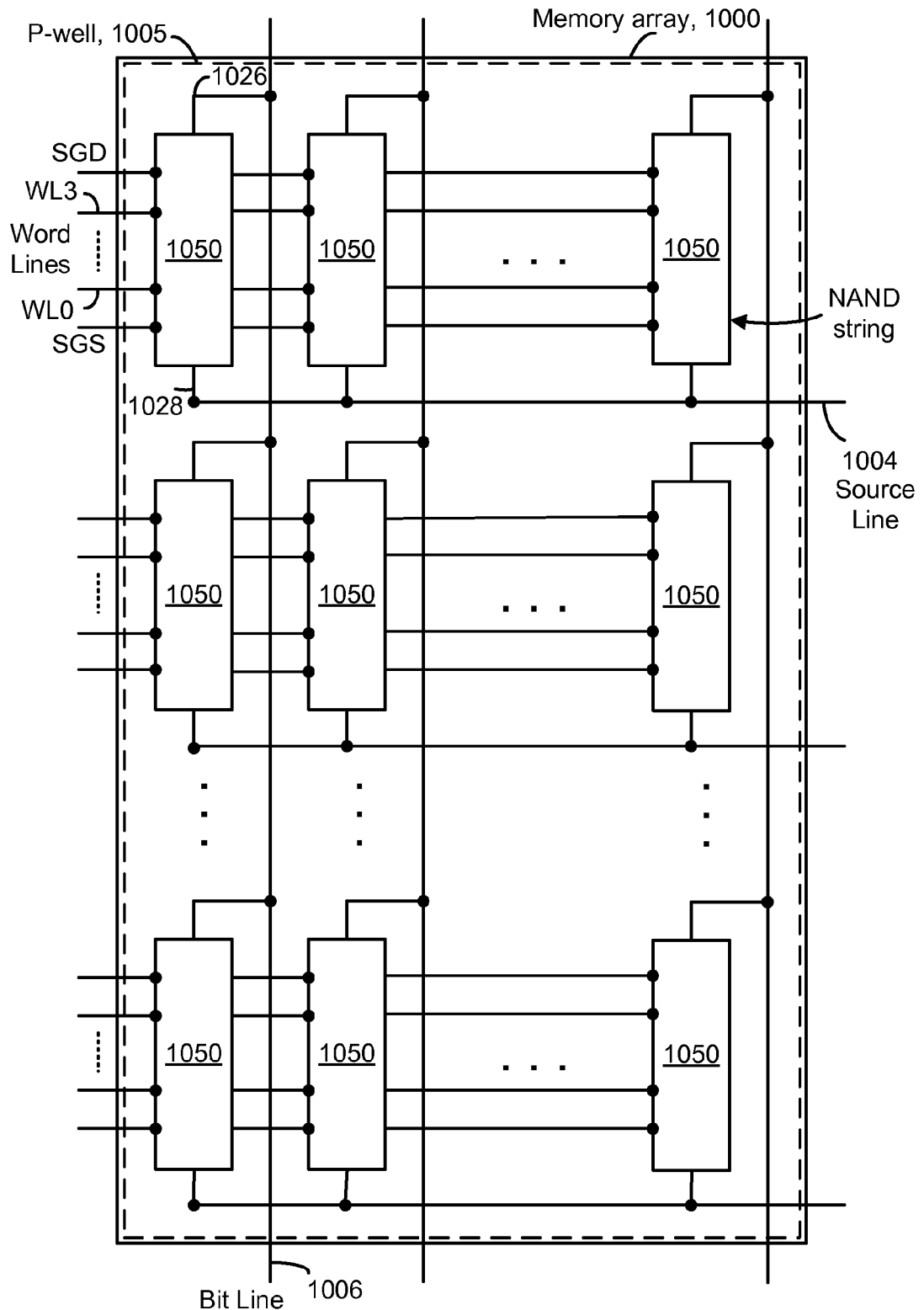
FIG. 10b depicts an example of an array of storage elements, including different sets of NAND strings.

FIG. 10b depicts an example of an array of storage elements, including different sets of NAND strings. Along each column of a memory array 1000, a bit line 1006 is coupled to the drain terminal 1026 of the drain select gate for the NAND string 1050. Along each row of NAND strings, a source line 1004 may connect all the source terminals 1028 of the source select gates of the NAND strings. An example of a NAND architecture array and its operation as part of a memory system is found in U.S. Pat. Nos. 5,570,315; 5,774,397; and 6,046,935.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is a unit of programming. In one embodiment, the individual pages may be divided into segments and the segments may contain the fewest number of storage elements that are written at one time as a basic programming operation. One or more pages of data are typically stored in one row of storage elements. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages. In some embodiments, a row of NAND strings comprises a block.

Memory storage elements are erased in one embodiment by raising the p-well to an erase voltage (e.g., 20 V) for a sufficient period of time and grounding the word lines of a selected block while the source and bit lines are floating. Due to capacitive coupling, the unselected word lines, bit lines, select lines, and c-source are also raised to a significant fraction of the erase voltage. A strong electric field is thus applied to the tunnel oxide layers of selected storage elements and the data of the selected storage elements are erased as electrons of the floating gates are emitted to the substrate side, typically by Fowler-Nordheim tunneling mechanism. As electrons are transferred from the floating gate to the p-well region, the threshold voltage of a selected storage element is lowered. Erasing can be performed on the entire memory array, separate blocks, or another unit of storage elements.

Figure 11:
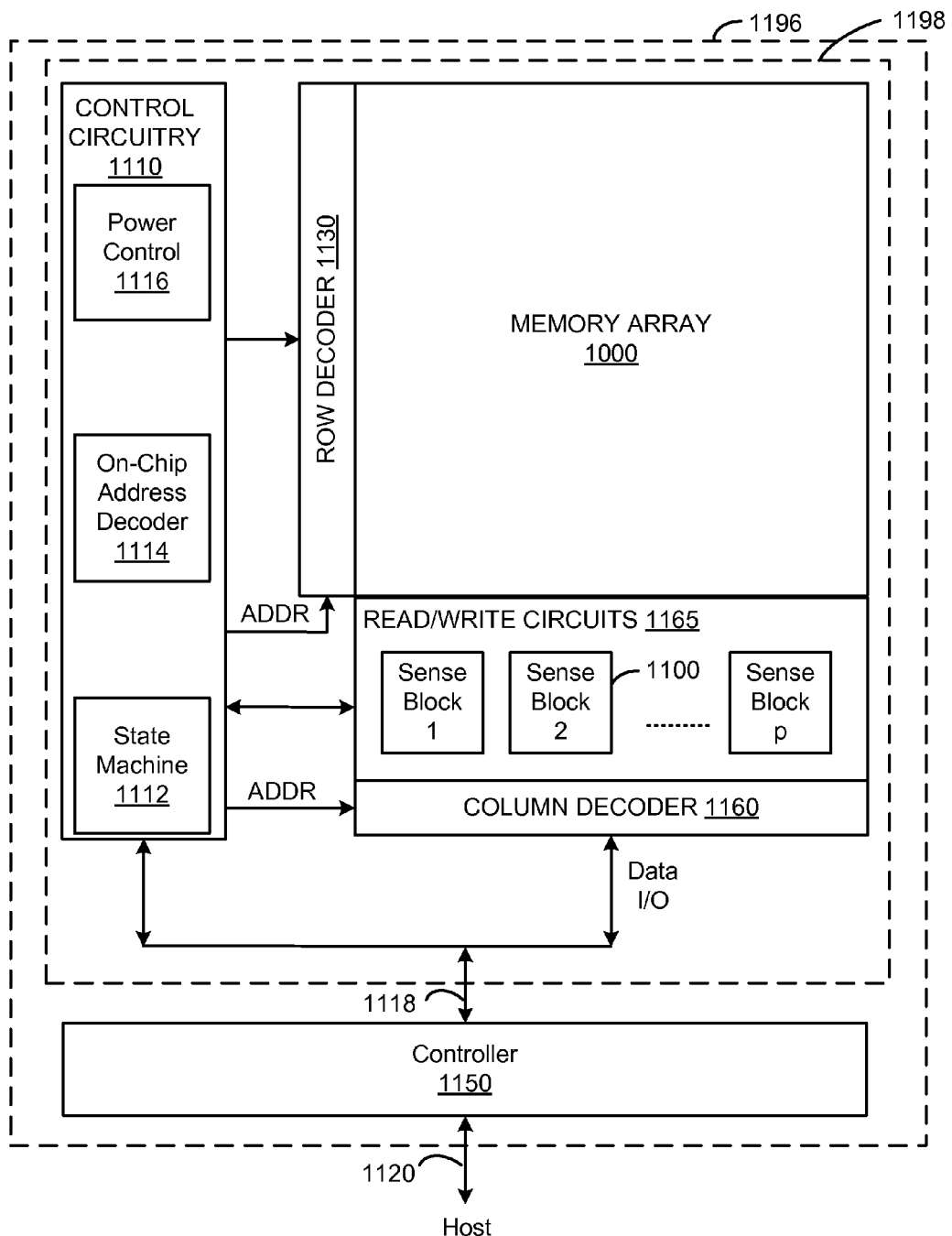
FIG. 11 is a block diagram of a non-volatile memory system using single row/column decoders and read/write circuits.

FIG. 11 is a block diagram of a non-volatile memory system using single row/column decoders and read/write circuits. The diagram illustrates a memory device 1196 having read/write circuits for reading and programming a page of storage elements in parallel, according to one embodiment of the present invention. Memory device 1196 may include one or more memory die 1198. Memory die 1198 includes a two-dimensional array of storage elements 1000, control circuitry 1110, and read/write circuits 1165. In some embodiments, the array of storage elements can be three dimensional. The memory array 1000 is addressable by word lines via a row decoder 1130 and by bit lines via a column decoder 1160. The read/write circuits 1165 include multiple sense blocks 1100 and allow a page of storage elements to be read or programmed in parallel. Typically a controller 1150 is included in the same memory device 1196 (e.g., a removable storage card) as the one or more memory die 1198. Commands and Data are transferred between the host and controller 1150 via lines 1120 and between the controller and the one or more memory die 1198 via lines 1118.

The control circuitry 1110 cooperates with the read/write circuits 1165 to perform memory operations on the memory array 1000. The control circuitry 1110 includes a state machine 1112, an on-chip address decoder 1114 and a power control module 1116. The state machine 1112 provides chip-level control of memory operations. The on-chip address decoder 1114 provides an address interface between that used by the host or a memory controller to the hardware address used by the decoders 1130 and 1160. The power control module 1116 controls the power and voltages supplied to the word lines and bit lines during memory operations.

In some implementations, some of the components of FIG. 11 can be combined. In various designs, one or more of the components (alone or in combination), other than storage element array 1000, can be thought of as a managing or control circuit. For example, one or more managing or control circuits may include any one of or a combination of control circuitry 1110, state machine 1112, decoders 1114/1160, power control 1116, sense blocks 1100, read/write circuits 1165, controller 1150, etc.

Figure 12:
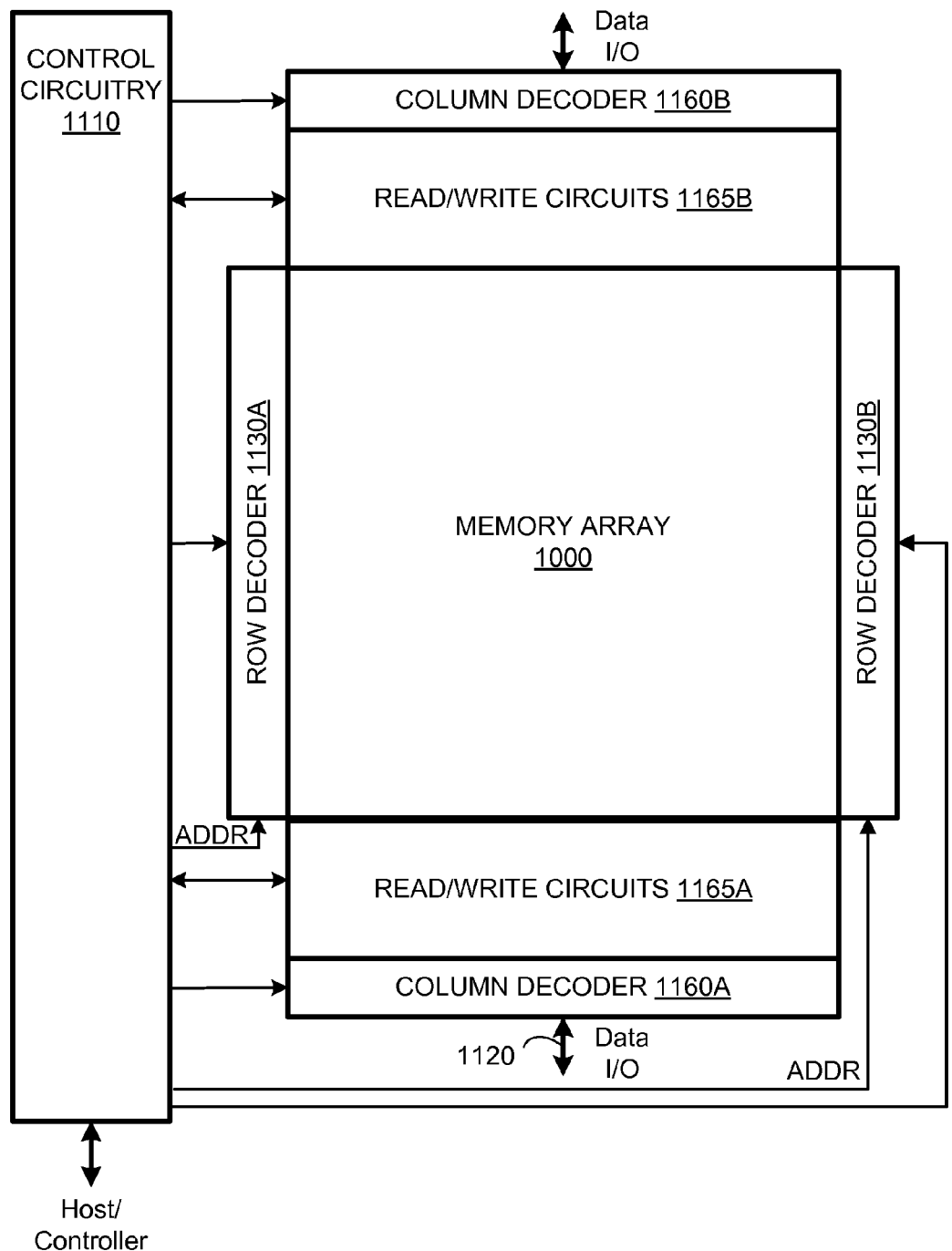
FIG. 12 is a block diagram of a non-volatile memory system using dual row/column decoders and read/write circuits.

FIG. 12 is a block diagram of a non-volatile memory system using dual row/column decoders and read/write circuits. Here, another arrangement of the memory device 1196 shown in FIG. 11 is provided. Access to the memory array 1000 by the various peripheral circuits is implemented in a symmetric fashion, on opposite sides of the array, so that the densities of access lines and circuitry on each side are reduced by half. Thus, the row decoder is split into row decoders 1130A and 1130B and the column decoder into column decoders 1160A and 1160B. Similarly, the read/write circuits are split into read/write circuits 1165A connecting to bit lines from the bottom and read/write circuits 1165B connecting to bit lines from the top of the array 1000. In this way, the density of the read/write modules is essentially reduced by one half. The device of FIG. 12 can also include a controller, as described above for the device of FIG. 11.

Figure 13:
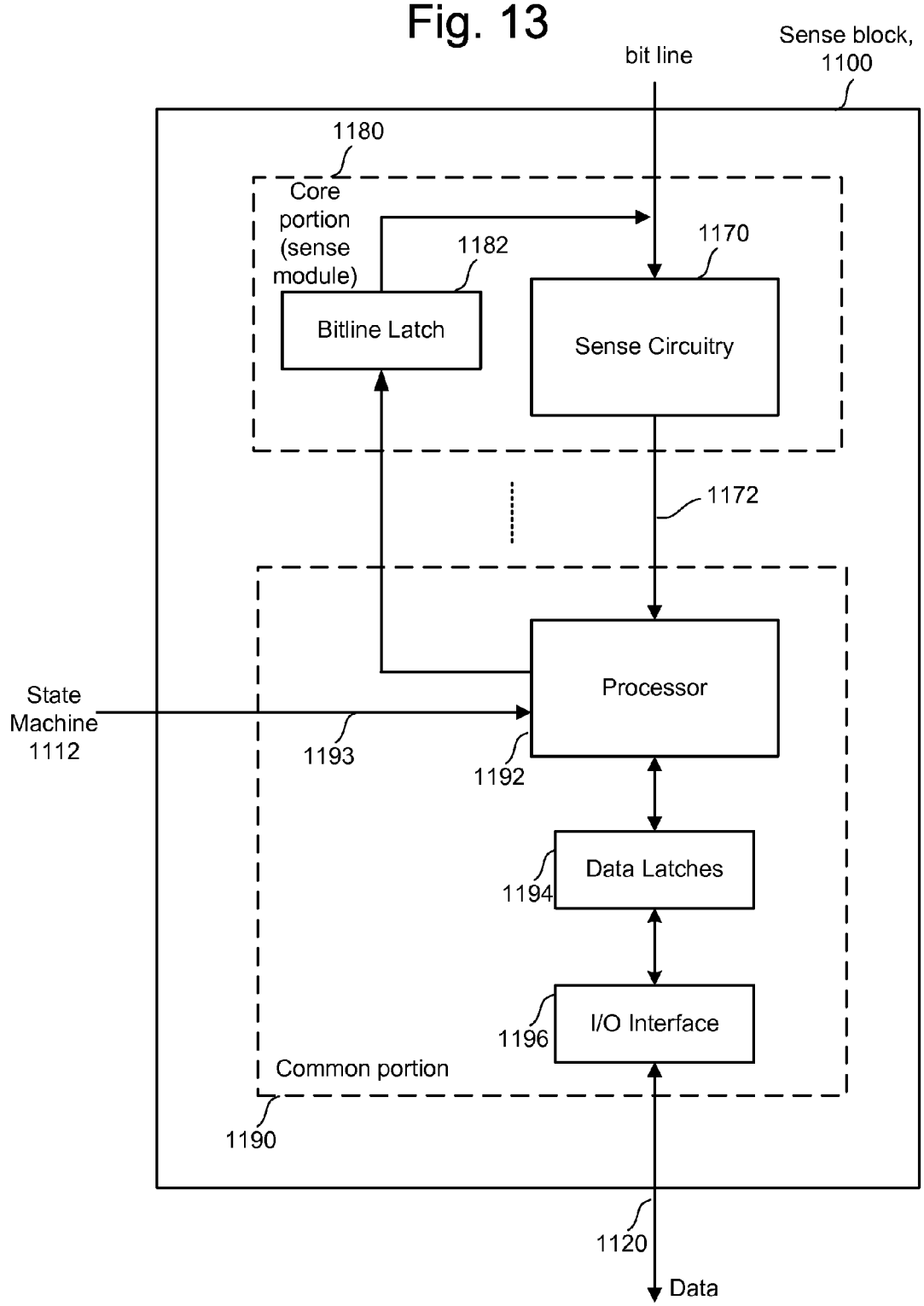
FIG. 13 is a block diagram depicting one embodiment of a sense block.

FIG. 13 is a block diagram depicting one embodiment of a sense block. An individual sense block 1100 is partitioned into a core portion, referred to as a sense module 1180, and a common portion 1190. In one embodiment, there will be a separate sense module 1180 for each bit line and one common portion 1190 for a set of multiple sense modules 1180. In one example, a sense block will include one common portion 1190 and eight sense modules 1180. Each of the sense modules in a group will communicate with the associated common portion via a data bus 1172. For further details refer to U.S. Patent Application Pub No. 2006/0140007, titled "Non-Volatile Memory and Method with Shared Processing for an Aggregate of Sense Amplifiers" published Jun. 29, 2006, and incorporated herein by reference in its entirety.

Sense module 1180 comprises sense circuitry 1170 that determines whether a conduction current in a connected bit line is above or below a predetermined threshold level. Sense module 1180 also includes a bit line latch 1182 that is used to set a voltage condition on the connected bit line. For example, a predetermined state latched in bit line latch 1182 will result in the connected bit line being pulled to a state designating program inhibit (e.g., $V_{DD}$).

Common portion 1190 comprises a processor 1192, a set of data latches 1194 and an I/O Interface 1196 coupled between the set of data latches 1194 and data bus 1120. Processor 1192 performs computations. For example, one of its functions is to determine the data stored in the sensed storage element and store the determined data in the set of data latches. The set of data latches 1194 is used to store data bits determined by processor 1192 during a read operation. It is also used to store data bits imported from the data bus 1120 during a program operation. The imported data bits represent write data meant to be programmed into the memory. I/O interface 1196 provides an interface between data latches 1194 and the data bus 1120.

During read or sensing, the operation of the system is under the control of state machine 1112 that controls the supply of different control gate voltages to the addressed storage element. As it steps through the various predefined control gate voltages corresponding to the various memory states supported by the memory, the sense module 1180 may trip at one of these voltages and an output will be provided from sense module 1180 to processor 1192 via bus 1172. At that point, processor 1192 determines the resultant memory state by consideration of the tripping event(s) of the sense module and the information about the applied control gate voltage from the state machine via input lines 1193. It then computes a binary encoding for the memory state and stores the resultant data bits into data latches 1194. In another embodiment of the core portion, bit line latch 1182 serves double duty, both as a latch for latching the output of the sense module 1180 and also as a bit line latch as described above.

Some implementations can include multiple processors 1192. In one embodiment, each processor 1192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 1192 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 1194 from the data bus 1120. The program operation, under the control of the state machine, comprises a series of programming voltage pulses applied to the control gates of the addressed storage elements. Each programming pulse is followed by a read back (verify) to determine if the storage element has been programmed to the desired memory state. Processor 1192 monitors the read back memory state relative to the desired memory state. When the two are in agreement, the processor 1192 sets the bit line latch 1182 so as to cause the bit line to be pulled to a state designating program inhibit. This inhibits the storage element coupled to the bit line from further programming even if programming pulses appear on its control gate. In other embodiments the processor initially loads the bit line latch 1182 and the sense circuitry sets it to an inhibit value during the verify process.

Data latch stack 1194 contains a stack of data latches corresponding to the sense module. In one embodiment, there are three data latches per sense module 1180. In some implementations (but not required), the data latches are implemented as a shift register so that the parallel data stored therein is converted to serial data for data bus 1120, and vice versa. In the preferred embodiment, all the data latches corresponding to the read/write block of m storage elements can be linked together to form a block shift register so that a block of data can be input or output by serial transfer. In particular, the bank of r read/write modules is adapted so that each of its set of data latches will shift data in to or out of the data bus in sequence as if they are part of a shift register for the entire read/write block.

Additional information about the structure and/or operations of various embodiments of non-volatile storage devices can be found in (1) U.S. Pat. No. 7,196,931, issued Mar. 27, 2007, titled "Non-Volatile Memory And Method With Reduced Source Line Bias Errors"; (2) U.S. Pat. No. 7,023, 736, issued Apr. 4, 2006, titled "Non-Volatile Memory And Method with Improved Sensing"; (3) U.S. Pat. No. 7,046, 568, issued May 16, 2006, titled "Memory Sensing Circuit And Method For Low Voltage Operation"; (4) U.S. Patent Application Pub. 2006/0221692, published Oct. 5, 2006, titled "Compensating for Coupling During Read Operations of Non-Volatile Memory"; and (5) U.S. Patent Application Pub. No. 2006/0158947, published Jul. 20, 2006, titled "Reference Sense Amplifier For Non-Volatile Memory." All five of the immediately above-listed patent documents are incorporated herein by reference in their entirety.

FIG. 14 illustrates an example of an organization of a memory array into blocks for an all bit line memory architecture or for an odd-even memory architecture. Exemplary structures of memory array 1400 are described. As one example, a NAND flash EEPROM is described that is partitioned into 1,024 blocks. The data stored in each block can be simultaneously erased.

In one embodiment, the block is the minimum unit of storage elements that are simultaneously erased. In each block, in this example, there are 8,512 columns corresponding to bit lines BL0, BL1, . . . BL8511. In one embodiment referred to as an all bit line (ABL) architecture (architecture 1410), all the bit lines of a block can be simultaneously selected during read and program operations. Storage elements along a common word line and connected to any bit line can be programmed at the same time.

In the example provided, 64 storage elements and two dummy storage elements are connected in series to form a NAND string. There are sixty four data word lines and two dummy word lines, WL-d0 and WL-d1, where each NAND string includes sixty four data storage elements and two dummy storage elements. In other embodiments, the NAND strings can have more or less than 64 data storage elements and two dummy storage elements. Data memory cells can store user or system data. Dummy memory cells are typically not used to store user or system data.

One terminal of the NAND string is connected to a corresponding bit line via a drain select gate (connected to select gate drain lines SGD), and another terminal is connected to c-source via a source select gate (connected to select gate source line SGS).

In one embodiment, referred to as an odd-even architecture (architecture 1400), the bit lines are divided into even bit lines (BLe) and odd bit lines (BLo). In this case, storage elements along a common word line and connected to the odd bit lines are programmed at one time, while storage elements along a common word line and connected to even bit lines are programmed at another time. Data can be programmed into different blocks and read from different blocks concurrently. In each block, in this example, there are 8,512 columns that are divided into even columns and odd columns.

During one configuration of read and programming operations, 4,256 storage elements are simultaneously selected. The storage elements selected have the same word line and the same kind of bit line (e.g., even or odd). Therefore, 532 bytes of data, which form a logical page, can be read or programmed simultaneously, and one block of the memory can store at least eight logical pages (four word lines, each with odd and even pages). For multi-state storage elements, when each storage element stores two bits of data, where each of these two bits are stored in a different page, one block stores sixteen logical pages. Other sized blocks and pages can also be used.

For either the ABL or the odd-even architecture, storage elements can be erased by raising the p-well to an erase voltage (e.g., 20 V) and grounding the word lines of a selected block. The source and bit lines are floating. Erasing can be performed on the entire memory array, separate blocks, or another unit of the storage elements which is a portion of the memory device. Electrons are transferred from the floating gates of the storage elements to the p-well region so that the $V_{TH}$ of the storage elements becomes negative.

Figure 15:
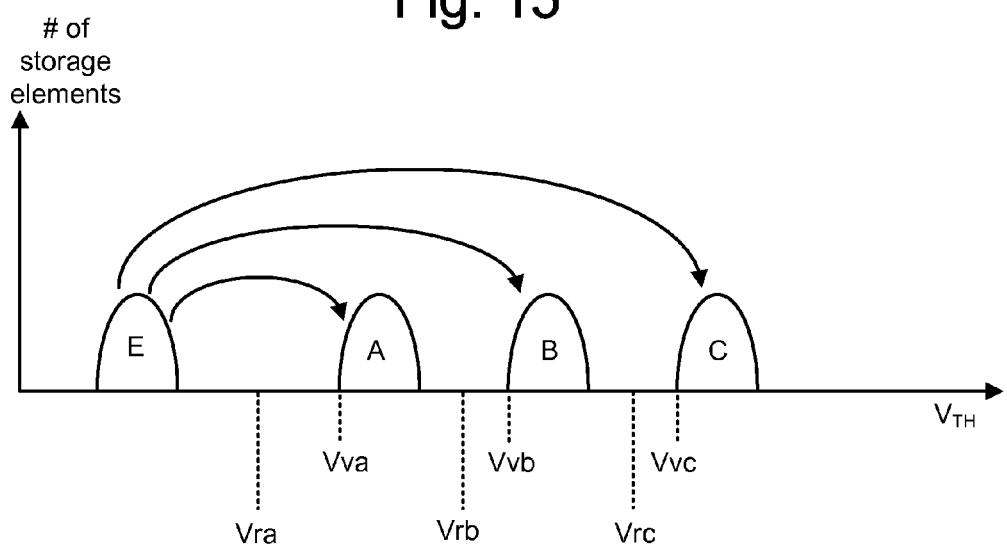
FIG. 15 depicts an example set of threshold voltage distributions with single pass programming.

FIG. 15 depicts an example set of threshold voltage distributions. Example $V_{TH}$ distributions for the storage element array are provided for a case where each storage element stores two bits of data. A first threshold voltage distribution E is provided for erased storage elements. Three threshold voltage distributions, A, B and C for programmed storage elements, are also depicted. In one embodiment, the threshold voltages in the E distribution are negative and the threshold voltages in the A, B and C distributions are positive.

Each distinct threshold voltage range corresponds to predetermined values for the set of data bits. The specific relationship between the data programmed into the storage element and the threshold voltage levels of the storage element depends upon the data encoding scheme adopted for the storage elements. For example, U.S. Pat. No. 6,222,762 and U.S. Patent Application Publication No. 2004/0255090, published Dec. 16, 2004, both of which are incorporated herein by reference in their entirety, describe various data encoding schemes for multi-state flash storage elements. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although four states are shown, the present invention can also be used with other multi-state structures including those that include more or fewer than four states.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. Additional read and reference values can be used when the storage elements store additional states. When programming storage elements to state A, the system will test whether those storage elements have a threshold voltage greater than or equal to Vva. When programming storage elements to state B, the system will test whether the storage elements have threshold voltages greater than or equal to Vvb. When programming storage elements to state C, the system will determine whether storage elements have their threshold voltage greater than or equal to Vvc.

In one embodiment, known as full sequence programming, storage elements can be programmed from the erase state E directly to any of the programmed states A, B or C. For example, a population of storage elements to be programmed may first be erased so that all storage elements in the population are in erased state E. A series of programming pulses such as depicted by the control gate voltage sequence of FIG. 19 will then be used to program storage elements directly into states A, B or C. While some storage elements are being programmed from state E to state A, other storage elements are being programmed from state E to state B and/or from state E to state C. When programming from state E to state C on a selected word line, WLi, the amount of parasitic coupling to the adjacent floating gate under WLi–1 is a maximized since the change in amount of charge on the floating gate under WLi is largest as compared to the change in voltage when programming from state E to state A or state E to state B. When programming from state E to state B the amount of coupling to the adjacent floating gate is reduced but still significant. When programming from state E to state A the amount of coupling is reduced even further. Consequently the amount of correction required to subsequently read each state of WLi–1 will vary depending on the state of the adjacent storage element on WLi.

Figure 16:
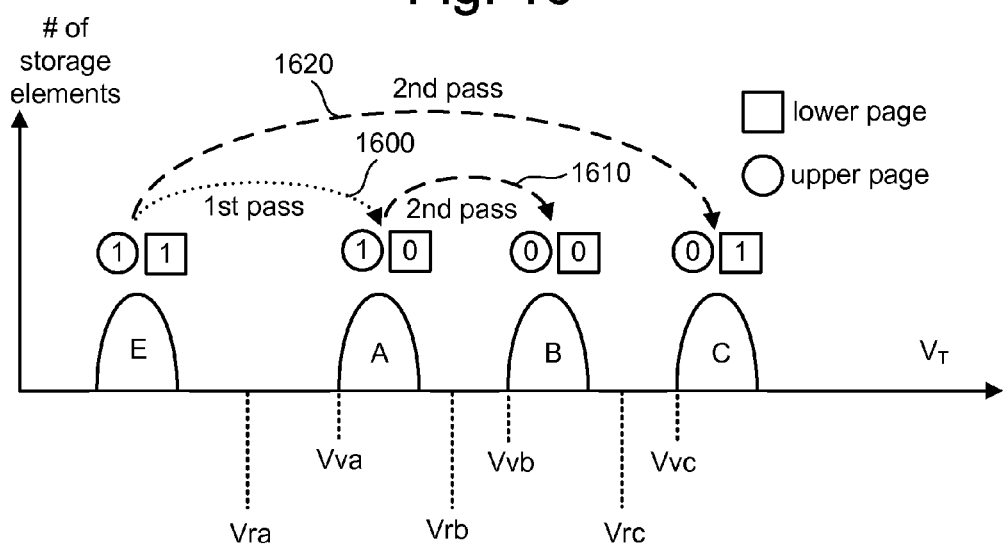
FIG. 16 depicts an example set of threshold voltage distributions with multi-pass programming.

FIG. 16 illustrates an example of a two-pass technique of programming a multi-state storage element that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned.

In a first programming pass, the storage element's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the storage element is increased to be state A, as shown by arrow 1600. That concludes the first programming pass.

In a second programming pass, the storage element's threshold voltage level is set according to the bit being programmed into the upper logical page. If the upper logical page bit is to store a logic "1," then no programming occurs since the storage element is in one of the states E or A, depending upon the programming of the lower page bit, both of which carry an upper page bit of "1." If the upper page bit is to be a logic "0," then the threshold voltage is shifted. If the first pass resulted in the storage element remaining in the erased state E, then in the second phase the storage element is programmed so that the threshold voltage is increased to be within state C, as depicted by arrow 1620. If the storage element had been programmed into state A as a result of the first programming pass, then the storage element is further programmed in the second pass so that the threshold voltage is increased to be within state B, as depicted by arrow 1610. The result of the second pass is to program the storage element into the state designated to store a logic "0" for the upper page without changing the data for the lower page. In both FIG. 15 and FIG. 16, the amount of coupling to the floating gate on the adjacent word line depends on the final state.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's storage elements. More details of such an embodiment are disclosed in U.S. Patent Application Pub. No. 2006/0126390, titled "Pipelined Programming of Non-Volatile Memories Using Early Data," published Jun. 15, 2006, incorporated herein by reference in its entirety.

Figure 17A:
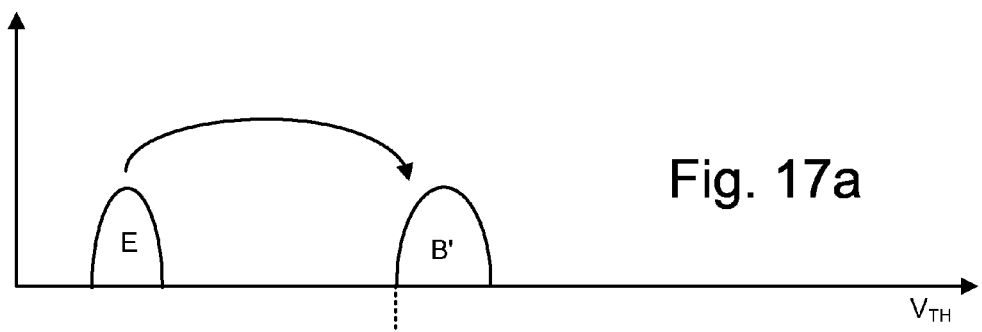
FIGS. 17a-c show various threshold voltage distributions and describe a process for programming non-volatile memory.
Figure 17B:
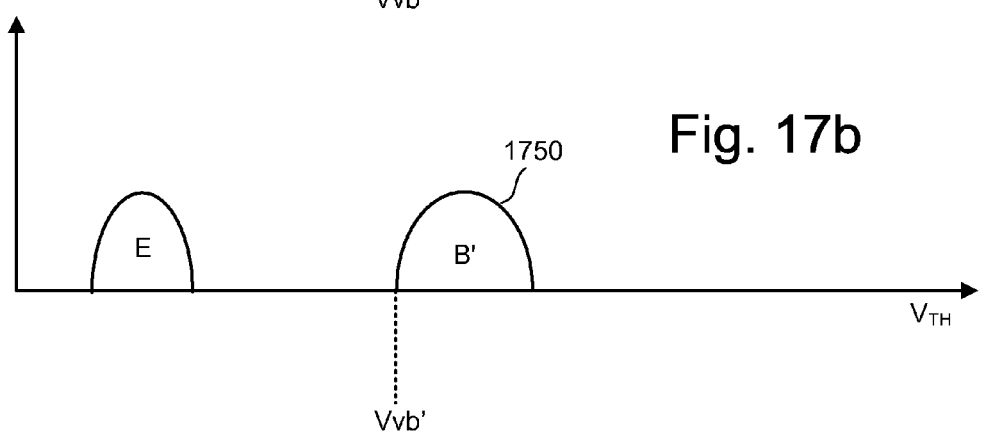
Figure 17C:
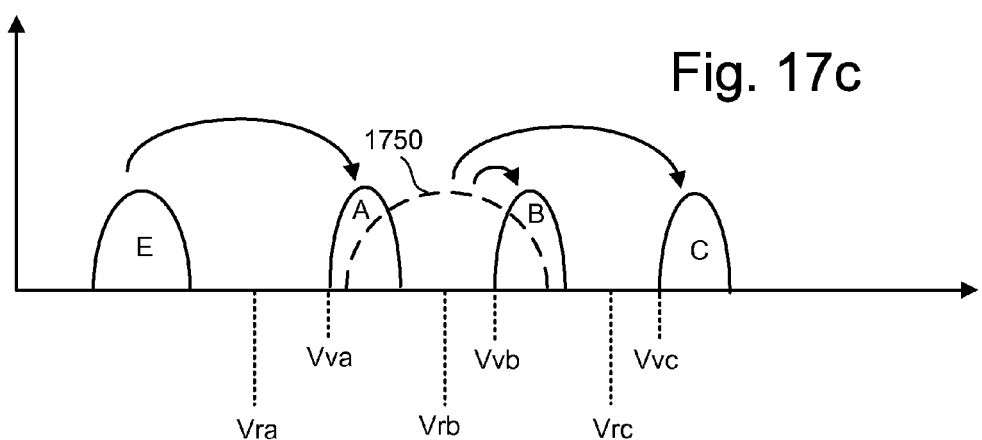

FIGS. 17a-c disclose another process for programming non-volatile memory that reduces the effect of floating gate to floating gate coupling by, for any particular storage element, writing to that particular storage element with respect to a particular page subsequent to writing to adjacent storage elements for previous pages. In one example implementation, the non-volatile storage elements store two bits of data per storage element, using four data states. For example, assume that state E is the erased state and states A, B and C are the programmed states. State E stores data 11. State A stores data 01. State B stores data 10. State C stores data 00. This is an example of non-Gray coding because both bits change between adjacent states A and B. Other encodings of data to physical data states can also be used. Each storage element stores two pages of data. For reference purposes, these pages of data will be called upper page and lower page; however, they can be given other labels. With reference to state A, the upper page stores bit 0 and the lower page stores bit 1. With reference to state B, the upper page stores bit 1 and the lower page stores bit 0. With reference to state C, both pages store bit data 0.

The programming process is a two-step process. In the first step, the lower page is programmed. If the lower page is to remain data 1, then the storage element state remains at state E. If the data is to be programmed to 0, then the threshold of voltage of the storage element is raised such that the storage element is programmed to state B'. FIG. 17a therefore shows the programming of storage elements from state E to state B'. State B' is an interim state B; therefore, the verify point is depicted as Vvb', which is lower than Vvb.

In one embodiment, after a storage element is programmed from state E to state B', its neighbor storage element (WLn+1) in the NAND string will then be programmed with respect to its lower page. For example, looking back at FIG. 2, after the lower page for storage element 106 is programmed, the lower page for storage element 104 would be programmed. After programming storage element 104, the floating gate to floating gate coupling effect will raise the apparent threshold voltage of storage element 106 if storage element 104 had a threshold voltage raised from state E to state B'. This will have the effect of widening the threshold voltage distribution for state B' to that depicted as threshold voltage distribution 1750 of FIG. 17b. This apparent widening of the threshold voltage distribution will be remedied when programming the upper page.

FIG. 17c depicts the process of programming the upper page. If the storage element is in erased state E and the upper page is to remain at 1, then the storage element will remain in state E. If the storage element is in state E and its upper page data is to be programmed to 0, then the threshold voltage of the storage element will be raised so that the storage element is in state A. If the storage element was in intermediate threshold voltage distribution 1750 and the upper page data is to remain at 1, then the storage element will be programmed to final state B. If the storage element is in intermediate threshold voltage distribution 1750 and the upper page data is to become data 0, then the threshold voltage of the storage element will be raised so that the storage element is in state C.

The process depicted by FIGS. 17a-c reduces the effect of floating gate to floating gate coupling because only the upper page programming of neighbor storage elements will have an effect on the apparent threshold voltage of a given storage element. An example of an alternate state coding is to move from distribution 1750 to state C when the upper page data is a 1, and to move to state B when the upper page data is a 0.

Although FIGS. 17a-c provide an example with respect to four data states and two pages of data, the concepts taught can be applied to other implementations with more or fewer than four states and different than two pages. For example, FIGS. 5a-d discussed an embodiment with three pages: lower, middle and upper.

Figure 18:
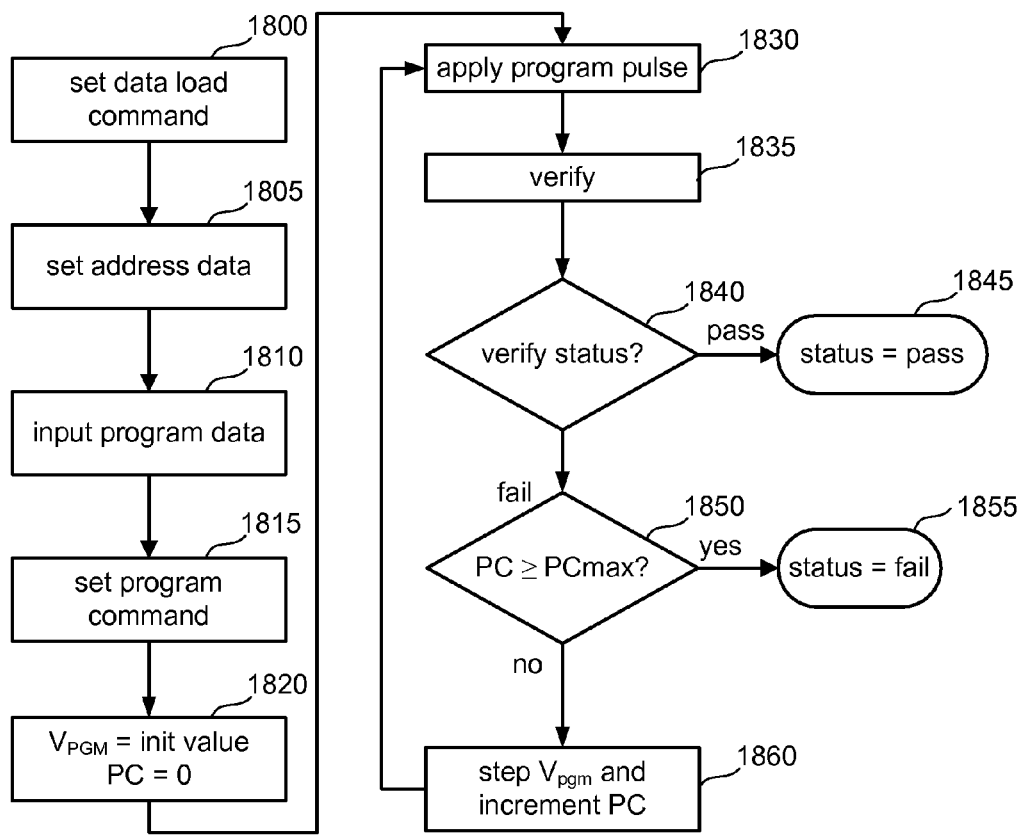
FIG. 18 is a flow chart describing one embodiment of a process for programming non-volatile memory.

FIG. 18 is a flow chart describing one embodiment of a method for programming non-volatile memory. In one implementation, storage elements are erased (in blocks or other units) prior to programming. In step 1800, a "data load" command is issued by the controller and input received by control circuitry 1110. In step 1805, address data designating the page address is input to decoder 1114 from the controller or host. In step 1810, a page of program data for the addressed page is input to a data buffer for programming. That data is latched in the appropriate set of latches. In step 1815, a "program" command is issued by the controller to state machine 1112.

Figure 19:
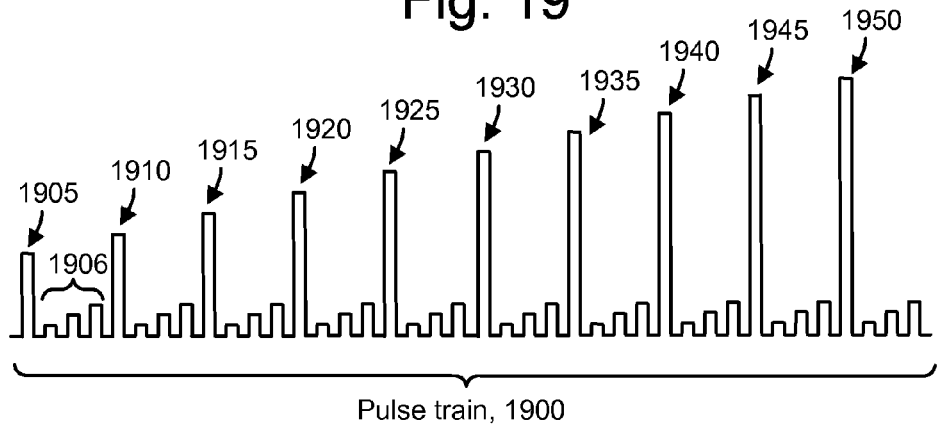
FIG. 19 depicts an example pulse train applied to the control gates of non-volatile storage elements during programming.

Triggered by the "program" command, the data latched in step 1810 will be programmed into the selected storage elements controlled by state machine 1112 using the stepped program pulses of the pulse train 1900 of FIG. 19 applied to the appropriate selected word line. In step 1820, the program voltage, $V_{PGM}$, is initialized to the starting pulse (e.g., 12 V or other value) and a program counter (PC) maintained by state machine 1112 is initialized at zero. In step 1830, the first $V_{PGM}$ pulse is applied to the selected word line to begin programming storage elements associated with the selected word line. If logic "0" is stored in a particular data latch indicating that the corresponding storage element should be programmed, then the corresponding bit line is grounded. On the other hand, if logic "1" is stored in the particular latch indicating that the corresponding storage element should remain in its current data state, then the corresponding bit line is connected to $V_{dd}$ to inhibit programming.

In step 1835, the states of the selected storage elements are verified. If it is detected that the target threshold voltage of a selected storage element has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine (via the wired-OR type mechanism described above) knows that all selected storage elements have been programmed. In step 1840, a check is made as to whether all of the data latches are storing logic "1." If all of the data latches are storing logic "1," the programming process is complete and successful because all selected storage elements were programmed and verified. A status of "PASS" is reported in step 1845.

If, in step 1840, it is determined that not all of the data latches are storing logic "1," then the programming process continues. In step 1850, the program counter PC is checked against a program limit value PCmax. One example of a program limit value is twenty; however, other numbers can also be used. If the program counter PC is not less than PCmax, then the program process has failed and a status of "FAIL" is reported in step 1855. If the program counter PC is less than PCmax, then $V_{PGM}$ is increased by the step size and the program counter PC is incremented in step 1860. The process then loops back to step 1830 to apply the next $V_{PGM}$ pulse.

FIG. 19 depicts an example pulse train 1900 applied to the control gates of non-volatile storage elements during programming, and a switch in boost mode which occurs during a pulse train. The pulse train 1900 includes a series of program pulses 1905, 1910, 1915, 1920, 1925, 1930, 1935, 1940, 1945, 1950, . . . , that are applied to a word line selected for programming. In one embodiment, the programming pulses have a voltage, $V_{PGM}$, which starts at 12 V and increases by increments, e.g., 0.5 V, for each successive programming pulse until a maximum of 20 V is reached. In between the program pulses are verify pulses. For example, verify pulse set 1906 includes three verify pulses. In some embodiments, there can be a verify pulse for each state that data is being programmed into, e.g., state A, B and C. In other embodiments, there can be more or fewer verify pulses. The verify pulses in each set can have amplitudes of Vva, Vvb and Vvc (FIG. 16) or Vvb' (FIG. 17*a*), for instance.

As mentioned, the voltages which are applied to word lines to implement a boost mode are applied when programming occurs, e.g., prior to and during a program pulse. In practice, the boost voltages of a boost mode can be initiated slightly before each program pulse and removed after each program pulse. On the other hand, during the verify process, for instance, which occurs between program pulses, the boost voltages are not applied. Instead, read voltages, which are typically less than the boost voltages, are applied to the unselected word lines. The read voltages have an amplitude which is sufficient to maintain the previously programmed storage elements in a NAND string on when the threshold voltage of a currently-programmed storage element is being compared to a verify level.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for operating a non-volatile storage system, comprising:
applying a first voltage to a selected word line which is associated with at least a first non-volatile storage element, the at least a first non-volatile storage element being provided in a set of non-volatile storage elements;
applying source and p-well voltages to a source and a p-well, respectively, which are associated with the at least a first non-volatile storage element during at least a portion of a time in which the first voltage is applied, the source and p-well voltages exceed the first voltage; and
determining whether the at least a first non-volatile storage element is in a conductive state or a non-conductive state using current sensing while applying the first voltage and the source and p-well voltages.

2. The method of claim 1, wherein:
during the current sensing, a fixed current flows through the at least a first non-volatile storage element and sinks into the source when the at least a first non-volatile storage element is in the conductive state.

3. The method of claim 1, wherein:
the using the current sensing comprises determining a voltage drop which is proportional to a fixed current which flows through the at least a first non-volatile storage element and sinks into the source when the at least a first non-volatile storage element is in the conductive state.

4. The method of claim 1, wherein:
regulating the source and p-well voltages to respective fixed DC levels during the applying of the source and p-well voltages.

5. The method of claim 1, wherein:
regulating the source and p-well voltages to a common fixed DC level during the applying of the source and p-well voltages.

6. The method of claim 1, wherein:
the at least a first non-volatile storage element is in a NAND string and the source voltage is applied to a source side of the NAND string.

7. The method of claim 1, wherein:
the first, source and p-well voltages are positive and the at least a first non-volatile storage element has a negative threshold voltage.

8. The method of claim 1, wherein the selected word line, the source and the p-well are associated with a plurality of adjacent non-volatile storage elements which include the at least a first non-volatile storage element, the method further comprising:
determining, concurrently, whether the plurality of non-volatile storage elements are in the conductive state or the non-conductive state using current sensing while applying the first voltage and the source and p-well voltages.

9. A method for operating a non-volatile storage system, comprising:
providing a potential of a drain associated with at least a first non-volatile storage element above a potential of a source associated with the at least a first non-volatile storage element;
applying positive voltages to the source and to a p-well associated with the at least a first non-volatile storage element while applying a positive voltage to a word line associated with the at least a first non-volatile storage element, a level of the voltage applied to the word line is less than levels of the voltages applied to the source and p-well;
while applying the voltages to the source, p-well and word line, performing current sensing with respect to a level of a current which flows through the at least a first non-volatile storage element and sinks into the source; and
determining a programming condition of the at least a first non-volatile storage element according to the sensing.

10. The method of claim 9, wherein:
the current sensing comprises determining a voltage drop which is proportional to the level of the current when the current is fixed.

11. The method of claim 9, wherein:
the programming condition is defined with respect to a negative threshold voltage.

12. The method of claim 11, further comprising:
applying different voltages to the source, p-well and word line for performing the current sensing when the negative threshold voltage is at different levels, the voltages applied to the source and p-well exceed the voltage applied to the word line for each different level of the negative threshold voltage.

13. The method of claim 9, wherein:
the at least a first non-volatile storage element is in a NAND string, the source comprises a source side of the NAND string, and the p-well comprises a p-well of the NAND string.

14. The method of claim 9, wherein the selected word line, the source and the p-well are associated with a plurality of adjacent non-volatile storage elements which include the at least a first non-volatile storage element, the method further comprising:
determining, concurrently, whether the plurality of non-volatile storage elements are in the conductive state or the non-conductive state using current sensing while applying the first voltage and the source and p-well voltages.

15. A method for operating a non-volatile storage system, comprising:
in a first sensing operation:
applying a first voltage to a control gate of at least a first non-volatile storage element, the at least a first non-volatile storage element being provided in a set of non-volatile storage elements;
applying a source voltage to a source which is associated with the at least a first non-volatile storage element during at least a portion of a time in which the first voltage is applied, the source voltage exceeds the first voltage; and
determining whether the at least a first non-volatile storage element is in a conductive state or a non-conductive state using current sensing while applying the first voltage and the source voltage; and
in a second sensing operation:
applying a second voltage to the control gate of the at least a first non-volatile storage element;
applying the source voltage to the source during at least a portion of a time in which the second voltage is applied; and
determining whether the at least a first non-volatile storage element is in a conductive state or a non-conductive state using current sensing while applying the second voltage and the source voltage.

16. The method of claim 15, further comprising:
applying a p-well voltage to a p-well which is associated with the at least a first non-volatile storage element during at least a portion of a time in which the first voltage is applied, and during at least a portion of a time in which the second voltage is applied.

17. The method of claim 15, wherein:
the at least a first non-volatile storage element is in a NAND string, the source comprises a source side of the NAND string, and the p-well comprises a p-well of the NAND string.

18. The method of claim 15, wherein:
the first and second sensing operations are part of read or verify operations.

19. The method of claim 15, further comprising:
during the current sensing of the first and second sensing operations, a fixed current flows through the at least a first non-volatile storage element and sinks into the source when the at least a first non-volatile storage element is in the conductive state.

* * * * *